(12) United States Patent
Fujiwara et al.

(10) Patent No.: US 8,891,055 B2
(45) Date of Patent: Nov. 18, 2014

(54) MAINTENANCE METHOD, MAINTENANCE DEVICE, EXPOSURE APPARATUS, AND DEVICE MANUFACTURING METHOD

(71) Applicant: Nikon Corporation, Tokyo (JP)

(72) Inventors: Tomoharu Fujiwara, Ageo (JP); Yasufumi Nishii, Kumagaya (JP); Kenichi Shiraishi, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/871,452

(22) Filed: Apr. 26, 2013

(65) Prior Publication Data

US 2013/0235359 A1      Sep. 12, 2013

Related U.S. Application Data

(63) Continuation of application No. 12/805,715, filed on Aug. 16, 2010, now Pat. No. 8,456,608, which is a continuation of application No. 11/662,452, filed as application No. PCT/JP2005/022308 on Dec. 5, 2005, now Pat. No. 7,804,576.

(30) Foreign Application Priority Data

Dec. 6, 2004    (JP) .................................. 2004-353093

(51) Int. Cl.
*G03F 7/20*        (2006.01)
(52) U.S. Cl.
CPC ........ *G03F 7/70341* (2013.01); *G03F 7/70925* (2013.01); *G03F 7/70975* (2013.01); *G03F 7/2041* (2013.01)

USPC .................. 355/30; 355/52; 355/53; 355/55; 355/72; 355/77

(58) Field of Classification Search
USPC ........... 355/30, 50, 52, 53, 55, 67–71, 72–74, 355/77; 430/5, 8, 22, 30, 311, 312, 322; 250/492.1, 492.2, 492.22, 548
See application file for complete search history.

(56) References Cited

U.S. PATENT DOCUMENTS

| | | |
|---|---|---|
| 3,516,645 A | 6/1970 | Arndt et al. |
| 4,346,164 A | 8/1982 | Tabarelli et al. |
| 4,480,910 A | 11/1984 | Takanashi et al. |

(Continued)

FOREIGN PATENT DOCUMENTS

| | | |
|---|---|---|
| DE | 221563 A1 | 9/1983 |
| DE | 224448 A1 | 7/1985 |

(Continued)

OTHER PUBLICATIONS

Mar. 7, 2006 International Search Report from International Patent Application No. PCT/JP2005/022308.

(Continued)

*Primary Examiner* — Toan Ton
*Assistant Examiner* — Christina Riddle
(74) *Attorney, Agent, or Firm* — Oliff PLC

(57) ABSTRACT

An exposure apparatus is provided with a nozzle member that has at least one of a supply outlet which supplies the liquid and a collection inlet which recovers the liquid. By immersing the nozzle member in cleaning liquid LK stored in container, the nozzle member is cleaned.

20 Claims, 9 Drawing Sheets

(56) References Cited

U.S. PATENT DOCUMENTS

| | | | |
|---|---|---|---|
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,969,441 A | 10/1999 | Loopstra et al. | |
| 6,195,154 B1 | 2/2001 | Imai | |
| 6,496,257 B1 * | 12/2002 | Taniguchi et al. | 356/239.2 |
| 6,952,253 B2 | 10/2005 | Lof et al. | |
| 2001/0019399 A1 | 9/2001 | Hagiwara | |
| 2004/0165159 A1 | 8/2004 | Lof et al. | |
| 2005/0024609 A1 | 2/2005 | De Smit et al. | |
| 2005/0074704 A1 * | 4/2005 | Endo et al. | 430/322 |
| 2005/0078286 A1 * | 4/2005 | Dierichs et al. | 355/30 |
| 2005/0205108 A1 | 9/2005 | Chang et al. | |
| 2005/0280791 A1 * | 12/2005 | Nagasaka et al. | 355/53 |
| 2006/0028626 A1 | 2/2006 | Chang et al. | |
| 2006/0028628 A1 | 2/2006 | Lin et al. | |
| 2006/0050351 A1 * | 3/2006 | Higashiki | 359/228 |
| 2006/0077367 A1 * | 4/2006 | Kobayashi et al. | 355/53 |
| 2006/0103818 A1 | 5/2006 | Holmes et al. | |
| 2006/0110689 A1 | 5/2006 | Chang | |
| 2006/0132731 A1 | 6/2006 | Jansen et al. | |
| 2006/0250588 A1 | 11/2006 | Brandl | |
| 2006/0256316 A1 | 11/2006 | Tanno et al. | |
| 2007/0026345 A1 * | 2/2007 | Subramanian et al. | 430/311 |
| 2007/0285631 A1 | 12/2007 | Stavenga et al. | |

FOREIGN PATENT DOCUMENTS

| | | | |
|---|---|---|---|
| EP | 0 951 054 | 10/1999 | |
| EP | 1 612 850 | 2/2006 | |
| EP | 1 724 815 | 11/2006 | |
| EP | 1 783 822 | 5/2007 | |
| JP | A 58-202448 | 11/1983 | |
| JP | A 59-019912 | 2/1984 | |
| JP | A 62-065326 | 3/1987 | |
| JP | A 63-157419 | 6/1988 | |
| JP | A 04-305915 | 10/1992 | |
| JP | A 04-305917 | 10/1992 | |
| JP | A 05-062877 | 3/1993 | |
| JP | A 06-124873 | 5/1994 | |
| JP | A 07-220990 | 8/1995 | |
| JP | A 08-037149 | 2/1996 | |
| JP | A 08-316125 | 11/1996 | |
| JP | A 10-163099 | 6/1998 | |
| JP | A 10-214783 | 8/1998 | |
| JP | A 10-303114 | 11/1998 | |
| JP | A 10-340846 | 12/1998 | |
| JP | A 11-176727 | 7/1999 | |
| JP | A 2000-058436 | 2/2000 | |
| JP | T 2000-505958 | 5/2000 | |
| JP | A 2005-079222 | 3/2005 | |
| JP | A 2006-024706 | 1/2006 | |
| JP | A 2006-032750 | 2/2006 | |
| WO | WO 99/49504 A1 | 9/1999 | |
| WO | WO 2004/105107 A1 | 2/2004 | |
| WO | WO 2004/019128 A2 | 3/2004 | |
| WO | WO 2004/086468 A1 | 7/2004 | |
| WO | WO 2004/090577 A2 | 10/2004 | |
| WO | WO 2004/090956 A1 | 10/2004 | |
| WO | WO 2004/093130 A1 | 10/2004 | |
| WO | WO 2004086468 A1 * | 10/2004 | H01L 21/27 |
| WO | WO 2004093130 A2 * | 10/2004 | |
| WO | WO 2004105107 A1 * | 12/2004 | H01L 21/027 |
| WO | WO 2005/076323 A1 | 8/2005 | |
| WO | WO 2005/124833 A1 | 12/2005 | |

OTHER PUBLICATIONS

Mar. 7, 2006 Written Opinion of the International Searching Authority from underlying International Patent Application No. PCT/JP2005/022308.

Jan. 25, 2008 Supplementary European Search Report and the European Search Opinion from related European Patent Application No. 05811795.3.

Jun. 18, 2008 Office Action from European Patent Application No. 05811795.3.

Mar. 26, 2010 Office Action issued in European Patent Application No. 05811795.3.

Mar. 26, 2009 Office Action issued in U.S. Appl. No. 11/662,452.

May 14, 2010 Notice of Allowance issued in U.S. Appl. No. 11/662,452.

Jan. 15, 2010 Notice of Allowance issued in U.S. Appl. No. 11/662,452.

Feb. 15, 2011 Office Action issued in Japanese Patent Application No. 2006-546680 (with translation).

Jun. 20, 2012 Office Action issued in U.S. Appl. No. 12/805,715.

Feb. 1, 2013 Notice of Allowance issued in U.S. Appl. No. 12/805,715.

Mar. 10, 2006 Written Opinion of the International Searching Authority from underlying International Patent Application No. PCT/JP2005/022308.

* cited by examiner

MAINTENANCE METHOD, MAINTENANCE DEVICE, EXPOSURE APPARATUS, AND DEVICE MANUFACTURING METHOD

This is a Continuation of application Ser. No. 12/805,715 filed Aug. 16, 2010, which is a Continuation of application Ser. No. 11/662,452 filed Mar. 12, 2007, which in turn is a National Phase of Application No. PCT/JP2005/022308 filed Dec. 5, 2005, which claims priority to Japanese Patent Application No. 2004-353093 filed Dec. 6, 2004. The disclosures of the prior applications are hereby incorporated by reference herein in their entirety.

TECHNICAL FIELD

The present invention relates to a maintenance method of an exposure apparatus, a maintenance device, an exposure apparatus, and a device manufacturing method.

BACKGROUND ART

In the photolithography process, which is one of the processes for manufacturing micro-devices such as semiconductor devices or liquid crystal display devices, an exposure apparatus that projection-exposes a pattern formed on a mask onto a photosensitive substrate is used. Such an exposure apparatus has a mask stage that supports a mask and a substrate stage that supports a substrate and, while successively moving the mask stage and the substrate stage, exposes the pattern of the mask onto the substrate via a projection optical system. In manufacturing micro-devices, miniaturization of the pattern formed on a substrate is required in order to make such micro-devices high-density ones. To address this requirement, it is desired that the exposure apparatus have a still higher resolution. As a means for realizing such a still higher resolution, such a liquid immersion exposure apparatus as disclosed in PCT International Publication WO 99/49504, in which with the exposure light's optical path space between a projection optical system and a substrate being filled with a liquid, exposure processes are performed via the liquid, has been devised.

DISCLOSURE OF INVENTION

Problems to be Solved by the Invention

When, in performing an exposure process based on a liquid immersion method, a member which is in contact with the liquid immersion liquid, e.g., a nozzle member for the liquid immersion process, is contaminated because, for example, foreign particles adhere to the member, there arises a possibility that the member cannot maintain its desired performance. Furthermore, when a member that comes into contact with the liquid is contaminated, the liquid in turn may be contaminated, with the liquid coming into contact with the member. When the exposure light's optical path space is filled with such a contaminated liquid, the accuracies of the exposure and the measurement performed via the liquid come to deteriorate.

A purpose of some aspects of the invention is to provide a maintenance method of an exposure apparatus and a maintenance device through which the desired performance of a member that comes into contact with the liquid can be maintained. Furthermore, another purpose is to provide an exposure apparatus in which an exposure process and a measurement process can be performed via the liquid with high accuracy and a device manufacturing method that uses the exposure apparatus.

Means for Solving the Problem

In accordance with a first aspect of the present invention, there is provided a maintenance method for an exposure apparatus in which a liquid immersion region is formed on a substrate and the substrate is irradiated with exposure light via a first liquid forming the liquid immersion region to expose the substrate, wherein the exposure apparatus is provided with a nozzle member that has at least one of a supply outlet which supplies the first liquid and a collection inlet which recovers the first liquid and wherein in order to clean the nozzle member, the nozzle member is immersed in a second liquid stored in a predetermined container.

In accordance with the first aspect of the present invention, with the nozzle member being immersed in the second liquid stored in the predetermined container, the nozzle member can be cleaned. Thus, performance deterioration of the nozzle member can be prevented.

In accordance with a second aspect of the present invention, there is provided a maintenance device for an exposure apparatus in which a liquid immersion region is formed on a substrate and the substrate is irradiated with exposure light via a first liquid of the liquid immersion region to expose the substrate, wherein the exposure apparatus is provided with a nozzle member that has at least one of a supply outlet which supplies the first liquid and a collection inlet which recovers the first liquid and wherein in order to clean the nozzle member, an immersion portion which immerses the nozzle member in a second liquid is provided.

In accordance with the second aspect of the present invention, with the nozzle member being immersed in the second liquid by the immersion portion, the nozzle member can be cleaned. Thus, performance deterioration of the nozzle member can be prevented.

In accordance with a third aspect of the present invention, there is provided an exposure apparatus in which an optical path space on the light exit side of an optical element is filled with a first liquid and a substrate is irradiated with exposure light via the optical element and the first liquid to expose the substrate, the exposure apparatus comprising: an immersion portion that immerses a predetermined member in a second liquid in order to clean, within the exposure apparatus, the predetermined member that comes in contact with the first liquid.

In accordance with the third mode of the present invention, with the predetermined member being immersed in the second liquid by the immersion portion, the predetermined member can be cleaned. Thus, performance deterioration of the predetermined member can be prevented.

In accordance with a fourth aspect of the present invention, there is provided a device manufacturing method that uses the exposure apparatus of the above-described aspect.

In accordance with the fourth aspect of the present invention, devices can be manufacture by the use of the exposure apparatus in which contamination of the first liquid is prevented.

In accordance with the present invention, exposure processes and measurement processes via the liquid can be performed well.

BEST MODE FOR CARRYING OUT THE INVENTION

Figure 1:
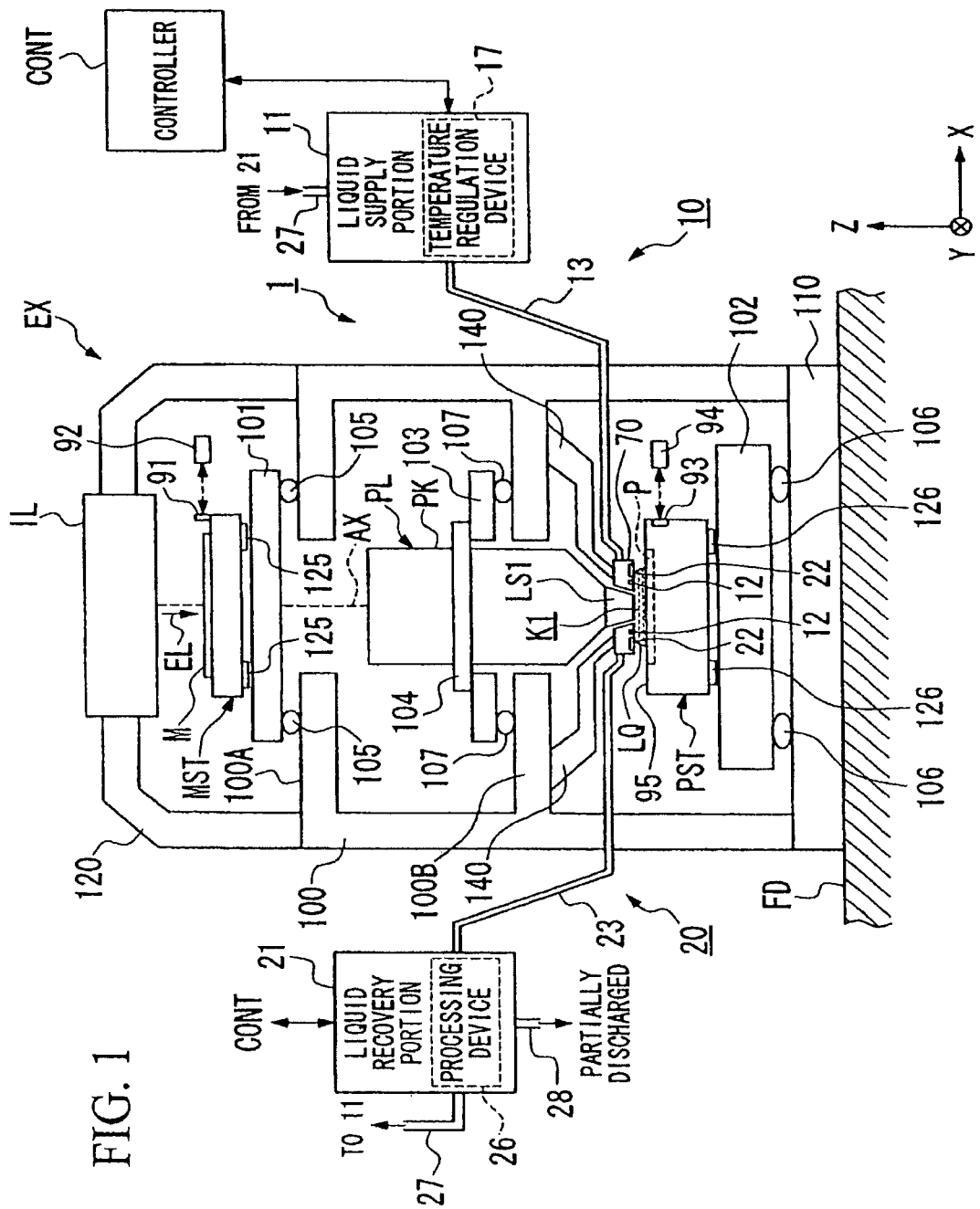
FIG. 1 is a schematic diagram showing an exposure apparatus embodiment.

In the following, embodiments of the present invention will be described referring to the drawings, but the present invention is not limited to those embodiments.

<Exposure Apparatus>

Figure 2:
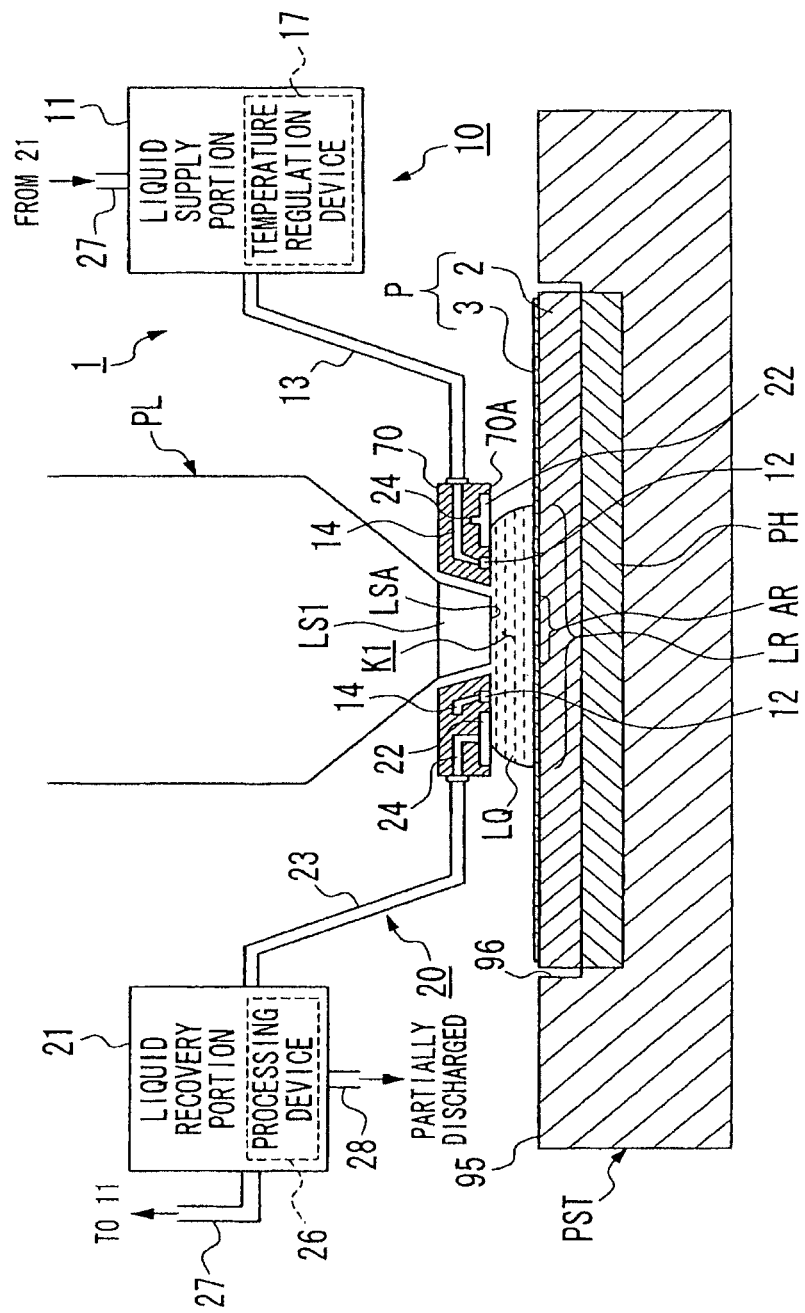
FIG. 2 is an enlarged view of the main part of FIG. 1.

An embodiment of an exposure apparatus will be described referring to FIGS. 1 and 2. FIG. 1 is a schematic diagram showing an embodiment of exposure apparatus EX; FIG. 2 is an enlarged view showing the vicinity of the image plane side end portion of projection optical system PL. In FIGS. 1 and 2, exposure apparatus EX is provided with mask stage MST that is movable while holding mask M, with substrate stage PST that is movable while holding substrate P, with illumination optical system IL that illuminates mask M held by mask stage MST with exposure light EL, with projection optical system PL that projects a pattern image of mask M illuminated with exposure light EL onto substrate P held by substrate stage PST, and with controller CONT that controls the overall operation of exposure apparatus EX.

Exposure apparatus EX of this embodiment is a liquid immersion exposure apparatus to which a liquid immersion method is applied, with the exposure wavelength being shortened in effect, to improve the resolution and, at the same time, to widen the depth of focus and is provided with liquid immersion mechanism 1 for filling optical path space K1 of exposure light EL on image plane side of projection optical system PL with liquid LQ. Liquid immersion mechanism 1 is provided with nozzle member 70 that is disposed in the vicinity of the image plane of projection optical system PL and that has supply ports 12 which supply liquid LQ and has collection port 22 which recovers liquid LQ, with liquid supply device 10 that supplies liquid LQ to the image side portion of projection optical system PL via supply ports 12 provided to nozzle member 70, and with liquid recovery device 20 that recovers liquid LQ existing on the image side portion of projection optical system PL via collection port 22 provided to nozzle member 70. Nozzle member 70 is disposed in the vicinity of first optical element LS1 located, among a plurality of optical elements constituting projection optical system PL, nearest to the image plane of projection optical system PL and is formed in a ring-shaped manner so as to surround first optical element LS1.

Exposure apparatus EX adopts a local liquid immersion system in which, at least while projecting the pattern image of mask M onto substrate P, on a substrate P's portion that includes projection area AR of projection optical system PL is locally formed liquid immersion region LR that is larger than projection area AR and is smaller than substrate P by liquid LQ having been supplied from liquid supply device 10. More specifically, by filling optical path space K1 between undersurface LSA of first optical element LS1, which is located nearest to the image plane of projection optical system PL, and the upper surface of substrate P placed on the image plane side of projection optical system PL with liquid LQ and by irradiating, via liquid LQ between projection optical system PL and substrate P and via projection optical system PL, exposure light EL having passed through mask M onto substrate P, exposure apparatus EX projects the pattern image of mask M onto substrate P. By supplying a predetermined amount of liquid LQ onto substrate P by using liquid supply mechanism 10 and by, at the same time, recovering a predetermined amount of liquid LQ on substrate P by using liquid recovery mechanism 20, controller CONT locally forms on substrate P liquid LQ's liquid immersion region LR.

The embodiment will be described by assuming, as an example, a case where as exposure apparatus EX, a scan type exposure apparatus (the so-called scanning stepper) in which while synchronously moving mask M and substrate P in their respective scanning directions, the pattern formed on mask M is exposed onto substrate P is used. In the following description, it is assumed that the synchronous movement direction (scanning direction), in a horizontal plane, of mask M and substrate P is referred to as the X-axis direction, that the direction, in a horizontal plane, perpendicular to the X-axis direction is referred to as the Y-axis direction (non-scanning direction), and that the direction that is perpendicular to the X-axis- and Y-axis-directions and coincides with optical axis AX of projection optical system PL is referred to as the Z-axis direction. Furthermore, it is assumed that the direction around the X-axis, the direction around the Y-axis, and the direction around the Z-axis are respectively referred to as the θX-direction, the θY-direction, and the θZ-direction. It should be noted that a "substrate" referred to herein comprehends a substrate, e.g., a semiconductor wafer, over which a photosensitive material (resist) is applied, and a "mask" comprehends a reticle on which a device pattern to be reduction-projected onto the substrate is formed.

Illumination optical system IL has a light source for exposure, an optical integrator for uniforming the illuminance of the light flux emitted from the light source for exposure, a condenser lens for condensing exposure light EL from the optical integrator, a relay lens system, a field stop for setting an illumination area formed by exposure light EL on mask M, etc. A specified illumination area on mask M is illuminated, by illumination optical system IL, with exposure light EL having a uniform illuminance distribution. As exposure light EL radiated from illumination optical system IL, for example, emission lines (g-line, h-line, i-line) emitted from a mercury lamp, deep ultraviolet beams (DUV light beams) such as the KrF excimer laser beam (wavelength of 248 nm), or vacuum ultraviolet light beams (VUV light beams) such as the ArF excimer laser beam (wavelength of 193 nm) or the $F_2$ excimer laser beam (wavelength of 157 nm) may be used. In the embodiment, the ArF excimer laser beam is used.

In the embodiment, purified water is used as liquid LQ forming liquid immersion region LR. Purified water can transmit not only the ArF excimer laser beam but also, for example, emission lines (g-line, h-line, or i-line) emitted from a mercury lamp and deep ultraviolet beams (DUV light beams) such as the KrF excimer laser beam (wavelength of 248 nm).

Mask stage MST is movable while holding mask M. Mask stage MST holds mask M by means of vacuum suction (or electrostatic suction). Being driven by a mask stage driver including a linear motor etc. controlled by controller CONT, mask stage MST, in the state of holding mask M, is two-dimensionally movable in a plane perpendicular to optical axis AX, i.e., in the XY-plane, and is finely rotatable in the θZ-direction. On mask stage MST is set moving mirror 91. Furthermore, laser interferometer 92 is positioned at a position facing moving mirror 91. The two-dimensional position and the rotation angle in the θZ-direction (including the rotation angles in the θX- and θY-directions in some cases) of mask M on mask stage MST are measured by laser interferometer 92 in real time. The measurement results from laser interferometer 92 are outputted to controller CONT. By driving the mask stage driver based on the measurement results from laser interferometer 92, controller CONT performs the position control of mask M held by mask stage MST.

Projection optical system PL is for projecting the pattern image of mask M onto substrate P at a predetermined projection magnification of β and is constituted by a plurality of optical elements; these optical elements are held by lens barrel PK. In the embodiment, projection optical system PL is a reduction system of which projection magnification β is, e.g., ¼, ⅕, or ⅛. It should be noted that projection optical system PL may also be either a unit magnification system or a magnifying system. Furthermore, projection optical system PL may be either one of a refractive system which does not include any reflecting optical member, a reflection system which does not include any refractive optical element, or a catadioptric system which includes a reflecting optical member and a refractive optical element. Still further, among the plurality of optical elements constituting projection optical system PL, first optical element LS1, which is located nearest to the image plane of projection optical system PL, protrudes from lens barrel PK.

First optical element LS1 is made of fluorite. It should be noted that first optical element LS1 may alternatively be made of quartz. First optical element LS1 comes into contact with liquid LQ with which optical path space K1 is filled. Since fluorite has a high affinity for liquid (water) LQ (is lyophilic), undersurface (liquid contact surface) LSA of first optical element LS1 and liquid LQ can be made to be in good, direct contact with each other, and thus optical path space K1 between first optical element LS1 and substrate P can be assuredly filled with liquid LQ. It should be noted that first optical element LS1 may alternatively be made of quartz. Furthermore, lyophilic treatment may be applied to make undersurface LSA of first optical element LS1 lyophilic (hydrophilic), by, for example, coating the undersurface with $MgF_2$, $Al_2O_3$, or $SiO_2$.

Substrate stage PST has substrate holder PH which holds substrate P; substrate stage PST holds substrate P via substrate holder PH. Substrate stage PST is disposed on the image plane side of projection optical system PL and is movable in the image plane side of projection optical system PL. Substrate holder PH holds substrate P by means of, e.g., vacuum suction. On substrate stage PST is provided concave portion 96, and substrate holder PH for holding substrate P is disposed in concave portion 96. Furthermore, substrate stage PST's top face 95, which is other than concave portion 96, is made a flat surface so that it has a height substantially equal to that of (constitutes the same plane as) the surface of substrate P held by substrate holder PH.

Being driven by a substrate stage driver including a linear motor etc. controlled by controller CONT, substrate stage PST, in the state of holding substrate P via substrate holder PH, is two-dimensionally movable in the XY-plane and is finely rotatable in the θZ-direction. Furthermore, substrate stage PST is also movable in the Z-axis-direction, in the θX-direction, and in the θY-direction. Thus, the upper surface of substrate P supported by substrate stage PST is movable in the six-degree-of-freedom directions, i.e., in the X-axis-direction, in the Y-axis-direction, in the Z-axis-direction, in the θX-direction, in the θY-direction, and in the θZ-direction. On the side face of substrate stage PST is provided moving mirror 93. Furthermore, laser interferometer 94 is positioned at a position facing moving mirror 93. The two-dimensional position and the rotation angle of substrate P on substrate stage PST are measured by laser interferometer 94 in real time. In addition, exposure apparatus EX is provided with such an oblique-incidence type focus-leveling detection system (not shown) as disclosed in, e.g., Japanese Unexamined Patent Publication No. H08-37149 that detects the surface position information of the surface of substrate P supported by substrate stage PST. The focus-leveling detection system detects the surface position information of the upper surface of substrate P (position information in the Z-axis-direction and inclination information in the θX- and θY-directions of substrate P). It is to be noted that the focus-leveling detection system may be a system that detects the surface position information of substrate P via liquid LQ of liquid immersion region LR, a system that detects the surface position information of substrate P at the outside of liquid immersion region LR and not via liquid LQ, or a system that simultaneously uses a system that detects the surface position information of substrate P via liquid LQ and a system that detects the surface position information of substrate P not via liquid LQ. Furthermore, as the focus-leveling detection system, a system that uses an electric capacitance type sensor may be adopted. The measurement results from laser interferometer 94 are outputted to controller CONT. The detection results from the focus-leveling detection system are also outputted to controller CONT. By driving the substrate stage driver based on the detection results from the focus-leveling detection system, controller CONT controls the focus position (Z-position) and inclination angles (θX, θY) of substrate P to adjust the upper surface of substrate P to the image plane of projection optical system PL and, at the same time, performs, based on the measurement results from laser interferometer 94, the position control of substrate P in the X-axis-direction, in the Y-axis-direction, and in the θZ-direction.

Exposure apparatus EX is provided with main column 100 that supports mask stage MST, substrate stage PST, and projection optical system PL via first bed 101, second bed 102, and lens barrel bed 103, respectively. Main column 100 is set on base 110 placed on floor face FD. In main column 100 are formed upper side stage portion 100A and lower side stage portion 100B that protrude toward the inside of the column. Illumination optical system IL is supported by supporting frame 120 fixed on the top portion of main column 100.

At upper side stage portion 100A of main column 100 is supported first bed 101 via vibration isolation device 105 including an air mount, etc. On the undersurface of mask stage MST are provided a plurality of gas bearings (air bearings) 125, which are non-contact type bearings. Mask stage MST is supported by air bearings 125 in a non-contact manner relative to the upper surface (guide surface) of first bed 101 and, being driven by the mask stage driver, is two-dimensionally movable in the XY-plane and finely rotatable in the AZ-direction on first bed 101. Furthermore, in the center portions of mask stage MST and first bed 101 are formed opening portions through which the pattern image of mask M is made to pass. First bed 101 is vibrationally isolated by vibration isolation device 105 from main column 100 and base 110 (floor face FD) so that the vibrations of base 110 (floor face FD) and main column 100 do not transmit to first bed 101, which supports mask stage MST in a non-contact manner.

On the external wall of lens barrel PK, which holds projection optical system PL, is provided flange 104, and projection optical system PL is supported by lens barrel bed 103 via this flange 104. Between lens barrel bed 103 and lower side stage portion 100B of main column 100 is disposed vibration isolation device 107 including an air mount, etc., and lens barrel bed 103, which supports projection optical system PL, is supported by lower side stage portion 100B of main column 100 via vibration isolation device 107. Lens barrel bed 103 is vibrationally isolated by vibration isolation device 107 from main column 100 and base 110 (floor face FD) so that the vibrations of base 110 (floor face FD) and main column 100 do not transmit to lens barrel bed 103, which supports projection optical system PL.

On the undersurface of substrate stage PST are provided a plurality of gas bearings (air bearings) 126, which are non-contact type bearings. Furthermore, on base 110 is supported second bed 102 via vibration isolation device 106 including an air mount, etc. Substrate stage PST is supported by air bearings 126 in a non-contact manner relative to the upper surface (guide surface) of second bed 102 and, being driven by the substrate stage driver, is two-dimensionally movable in the XY-plane and finely rotatable in the AZ-direction on second bed 102. Second bed 102 is vibrationally isolated by vibration isolation device 106 from main column 100 and base 110 (floor face FD) so that the vibrations of base 110 (floor face FD) and main column 100 do not transmit to second bed 102, which supports substrate stage PST in a non-contact manner.

Nozzle member 70 of liquid immersion mechanism 1 is supported by lower side stage portion 100B of main column 100 via supporting mechanism 140. Supporting mechanism 140 is for supporting nozzle member 70 in a predetermined positional relationship relative to projection optical system PL. As described above, nozzle member 70 supported by supporting mechanism 140 is disposed in the vicinity of first optical element LS1 of projection optical system PL and is formed in a ring-shaped manner so as to surround first optical element LS1. Furthermore, supporting mechanism 140 supports nozzle member 70 so that a predetermined clearance (gap) is formed between first optical element LS1 and nozzle member 70.

Main column 100 supporting nozzle member 70 via supporting mechanism 140 and lens barrel bed 103 supporting projection optical system PL are vibrationally isolated from each other via vibration isolation device 107. Thus, the vibrations of nozzle member 70 are prevented from transmitting to projection optical system PL. Furthermore, main column 100 and first bed 101 supporting mask stage MST are vibrationally isolated from each other via vibration isolation device 105. Thus, the vibrations of nozzle member 70 are prevented from transmitting to mask stage MST. Furthermore, main column 100 and second bed 102 supporting substrate stage PST are vibrationally isolated from each other via vibration isolation device 106. Thus, the vibrations of nozzle member 70 are prevented from transmitting to substrate stage PST.

In addition, on lens barrel bed 103 are supported measurement systems, not shown, such as the above-described focus-leveling detection system and an off-axis type alignment system that detects alignment marks on substrate P, and thus those measurement systems are vibrationally isolated from main column 100 and nozzle member 70.

Next, liquid immersion mechanism 1 will be described. Nozzle member 70 has supply ports 12 that supply liquid LQ and collection port 22 that recovers liquid LQ. Supply ports 12 and collection port 22 are formed in undersurface 70A of nozzle member 70. Undersurface 70A of nozzle member 70 is set in a position where the undersurface can face the upper surface of substrate P and top face 95 of substrate stage PST. Nozzle member 70 is a ring-shaped member that is provided so as to surround the side face of first optical element LS1, and a plurality of supply ports 12 are provided so as to surround, at undersurface 70A of nozzle member 70, first optical element LS1 of projection optical system PL (optical axis AX of projection optical system PL). Furthermore, collection port 22 is, at undersurface 70A of nozzle member 70, provided at a position outside of and separated from supply ports 12 relative to first optical element LS1 and is provided in a ring-shaped form so as to surround first optical element LS1 and supply ports 12.

It is to be noted that while, in this embodiment, nozzle member 70 is provided with supply ports 12 and collection port 22, the supply ports and the collection port may be respectively provided in separate nozzle members. Furthermore, when it is not required to recover liquid LQ by a nozzle member disposed in the vicinity of first optical element LS1 of projection optical system PL, only the supply ports are required to be provided to nozzle member 70.

Nozzle member 70 is made of, e.g., stainless steel or titanium. While as with first optical element LS1, nozzle member 70 also comes into contact with liquid LQ with which optical path space K1 is filled, undersurface (liquid contact surface) 70A of nozzle member 70 and liquid LQ can be made to be in good, direct contact with each other by using such materials for the nozzle member, and thus liquid immersion region LR can be formed well between the undersurface and substrate P. Furthermore, optical path space K1 between first optical element LS1 and substrate P can be assuredly filled with liquid LQ. Still further, as with first optical element LS1, undersurface 70A of nozzle member 70 may be applied with lyophilic treatment.

Liquid supply device 10 is for supplying liquid LQ to the image plane side portion of projection optical system PL via supply ports 12 of nozzle member 70 and is provided with liquid supply portion 11 capable of delivering liquid LQ and with supply pipe 13 of which one end is connected to liquid supply portion 11. The other end of supply pipe 13 is connected to nozzle member 70. Inside nozzle member 70 is formed inner flow path (supply flow path) 14 that connects the other end of supply pipe 13 to supply ports 12. One end of supply flow path 14 is provided in the side face of nozzle member 70 and is connected to the other end of supply pipe 13. On the other hand, the other ends of supply flow path 14 are connected to supply ports 12 formed in undersurface 70A of nozzle member 70. In this regard, supply flow path 14 formed inside nozzle member 70 branches along its way into the other ends so that each of the other ends connects to each of the plurality of supply ports 12.

Liquid supply portion 11 is provided with a water purifying device, a temperature regulation device that regulates the temperature of liquid LQ (purified water) to be supplied, a tank that stores liquid LQ, a compressor, a filter unit that removes foreign particles in liquid LQ, etc. In the drawings, temperature regulation device 17 is shown by way of example. The liquid supply operation of liquid supply device 11 is controlled by controller CONT. It is to be noted that, with regard to the water purifying device, it may also be configured such that exposure apparatus EX is not provided with a water purifying device, and a water purifying device in a factory where exposure apparatus EX is set is utilized. Furthermore, exposure apparatus EX need not be supplied with all of the tank, the compressor, the filter unit, etc. of liquid supply device 10, and some of them may be substituted by the facilities of, e.g., a factory in which exposure apparatus EX is installed.

Liquid recovery mechanism 20 is for recovering liquid LQ existing on the image plane side portion of projection optical system PL via collection port 22 of nozzle member 70 and is provided with liquid recovery portion 21 capable of recovering liquid LQ and with recovery pipe 23 of which one end is connected to liquid recovery portion 21. The other end of recovery pipe 23 is connected to nozzle member 70. Inside nozzle member 70 is formed inner flow path (recovery flow path) 24 that connects the other end of recovery pipe 23 to collection port 22. One end of recovery flow path 24 is provided in the side face of nozzle member 70 and is connected to the other of recovery pipe 23. On the other hand, the other end of recovery flow path 24 is connected to collection port 22 formed in undersurface 70A of nozzle member 70. In this regard, recovery flow path 24 formed inside nozzle member 70 is provided with a ring-shaped flow path that is formed in a ring-shaped form as viewed from above so as to correspond to collection port 22 and with a manifold flow path that connects a portion of the ring-shaped flow path to the other end of recovery pipe 23.

Liquid recovery portion 21 is provided with a vacuum system (suction device), e.g., a vacuum pump, a gas-liquid separator that separates the recovered liquid LQ from gas, a tank that stores the recovered liquid LQ, etc. It should be noted that exposure apparatus EX need not be supplied with all of the vacuum system, the gas-liquid separator, the tank, etc. of liquid recovery mechanism 20, and some of them may be substituted by the facilities of, e.g., a factory in which exposure apparatus EX is installed.

It should be noted that while, in FIG. 1, it is illustrated that only nozzle member 70 is supported by supporting mechanism 140, supply pipe 13 and recovery pipe 23, which connect to nozzle member 70, may also be supported by supporting mechanism 140.

Furthermore, liquid recovery mechanism 20 is provided with processing device 26 that applies predetermined processes to the recovered liquid LQ. Processing device 26 is for making the recovered liquid LQ clean and is provided with, e.g., a filter unit and a distillation device. Liquid recovery mechanism 20 returns liquid LQ having been processed by processing device 26 to liquid supply mechanism 10 via return pipe 27. Exposure apparatus EX of the embodiment is provided with a circulation system that circulates liquid LQ between liquid supply mechanism 10 and liquid recovery mechanism 20, and thus the liquid LQ recovered by liquid recovery mechanism 20 is returned to liquid supply portion 11 of liquid supply mechanism 10.

Next, substrate P will be described referring to FIG. 2. Substrate P has base substrate 2 and photosensitive material 3 with which a portion of the upper surface of base substrate 2 is coated. Base substrate 2 comprehends, e.g., a silicon wafer (semiconductor wafer). Photosensitive material 3 coats substantially the entire area of the upper surface of base substrate 2 except its peripheral area with a predetermined thickness (e.g., about 200 nm).

When substrate P comes into contact with liquid LQ of liquid immersion region LR, some constituents of substrate P dissolve in liquid LQ. For example, in the case where as photosensitive material 3, a chemically amplified resist is used, the chemically amplified resist includes a base resin, a photo acid generator (PAG), and an amine substance called quencher. When such photosensitive material 3 comes into contact with liquid LQ, some constituents of photosensitive material 3, specifically PAG, the amine substance, etc. dissolve in liquid LQ. Furthermore, also in the case where base substrate 2 comes into contact with liquid LQ, there arises, depending upon the substance constituting base substrate 2, a possibility that base substrate 2's partial constituent (silicon) dissolves in liquid LQ.

As just described, liquid LQ having come into contact with substrate P may contain impurities generated from substrate P. Furthermore, liquid LQ may contain impurities (including a gas) in the air. Therefore, liquid LQ recovered by liquid recovery mechanism 20 may contain various kinds of impurities. To address this, after making a portion of the recovered liquid LQ clean by processing device 26, liquid recovery mechanism 20 returns the liquid LQ having been made clean to liquid supply mechanism 10. It should be noted that liquid recovery mechanism 20 of the embodiment does not return the remaining portion of the recovered liquid LQ to liquid supply mechanism 10 and discharges (discards) it to the outside of exposure apparatus EX via discharge pipe 28. Liquid LQ having been returned to liquid supply portion 11 of liquid supply mechanism 10 is, after being purified by the water purifying device, again supplied to optical path space K1 on the image plane side of projection optical system PL. Liquid supply mechanism 10 supplies again liquid LQ having returned from liquid recovery mechanism 20 to the image plane side portion of projection optical system PL to reuse it for liquid immersion exposure. It is to be noted that it may also be configured such that liquid recovery mechanism 20 returns all of the recovered liquid LQ to liquid supply mechanism 10.

It should be noted that it may also be configured such that exposure apparatus EX does not return liquid LQ recovered by liquid recovery mechanism 20 to liquid supply mechanism 10 and, after purifying liquid LQ supplied from a separate supply source or running water, supplies it to the image plane side portion of projection optical system PL.

Finally, by supplying a predetermined amount of liquid LQ onto substrate P by using liquid supply mechanism 10 and by, at the same time, recovering a predetermined amount of liquid LQ on substrate P by using liquid recovery mechanism 20, controller CONT locally forms on substrate P liquid immersion region LR of liquid LQ. In forming liquid immersion region LR of liquid LQ, controller CONT drives each of liquid supply portion 11 and liquid recovery portion 21. When liquid LQ is delivered from liquid supply portion 11 under control of controller CONT, the liquid LQ delivered from liquid supply portion 11 is, after flowing through supply pipe 13, supplied, via supply flow path 14 of nozzle member 70, from supply ports 12 to the image plane side portion of projection optical system PL. Furthermore, when liquid recovery portion 21 is driven under control of controller CONT, liquid LQ on the image plane side of projection optical system PL flows, via collection port 22, into recovery flow path 24 of nozzle member 70 and, after flowing through recovery pipe 23, is recovered by liquid recovery portion 21.

<Exposure Method>

Next, the method by which substrate P is exposed by using the above-described exposure apparatus EX will be described. When performing the liquid immersion exposure of substrate P, controller CONT fills, by the use of liquid immersion mechanism 1, optical path space K1 of exposure light EL between projection optical system PL and substrate P with liquid LQ to form liquid LQ's liquid immersion region LR on substrate P. By irradiating, via liquid LQ between projection optical system PL and substrate P and via projection optical system PL, exposure light EL having passed through mask M onto substrate P, controller CONT projects the pattern image of mask M onto substrate P. Exposure apparatus EX performs a liquid immersion exposure process of step-and-scan type on substrate P held by substrate stage PST.

As shown in, e.g., FIG. 2, liquid LQ fills the space, including exposure light EL's optical path space K1, between both of undersurface (liquid contact surface) LSA of first optical element LS1 and undersurface (liquid contact surface) 70A of nozzle member 70 and substrate P. In other words, liquid LQ comes into contact with not only substrate P, but also with undersurface LSA of first optical element LS1, undersurface 70A of nozzle member 70, etc.

As described above, liquid LQ having come into contact with substrate P contains impurities generated from substrate P, etc. Thus, when the liquid LQ containing such impurities comes into contact with nozzle member 70, there arises the possibility that the impurities in liquid LQ attach to nozzle member 70, and thus nozzle member 70 is contaminated. In particular, the impurities are likely to attach at the vicinity of nozzle member 70's collection port 22 and at nozzle member 70's recovery flow path 24. Furthermore, when a porous body is provided to collection port 22, the impurities are to attach also to the porous body. Finally, if the condition in which the impurities attach is left as it is, then not only the recovery operation on liquid LQ becomes unstable, but also, even if clean liquid LQ is supplied to optical path space K1, the supplied liquid LQ is contaminated, with the liquid coming into contact with the contaminated nozzle member 70, etc.

To address this problem, maintenance (cleaning) of nozzle member 70 is performed by using a maintenance device. In the following, methods for maintaining nozzle member 70 using a maintenance device will be described.

<First Embodiment of Maintenance Device and Method>

Figure 3:
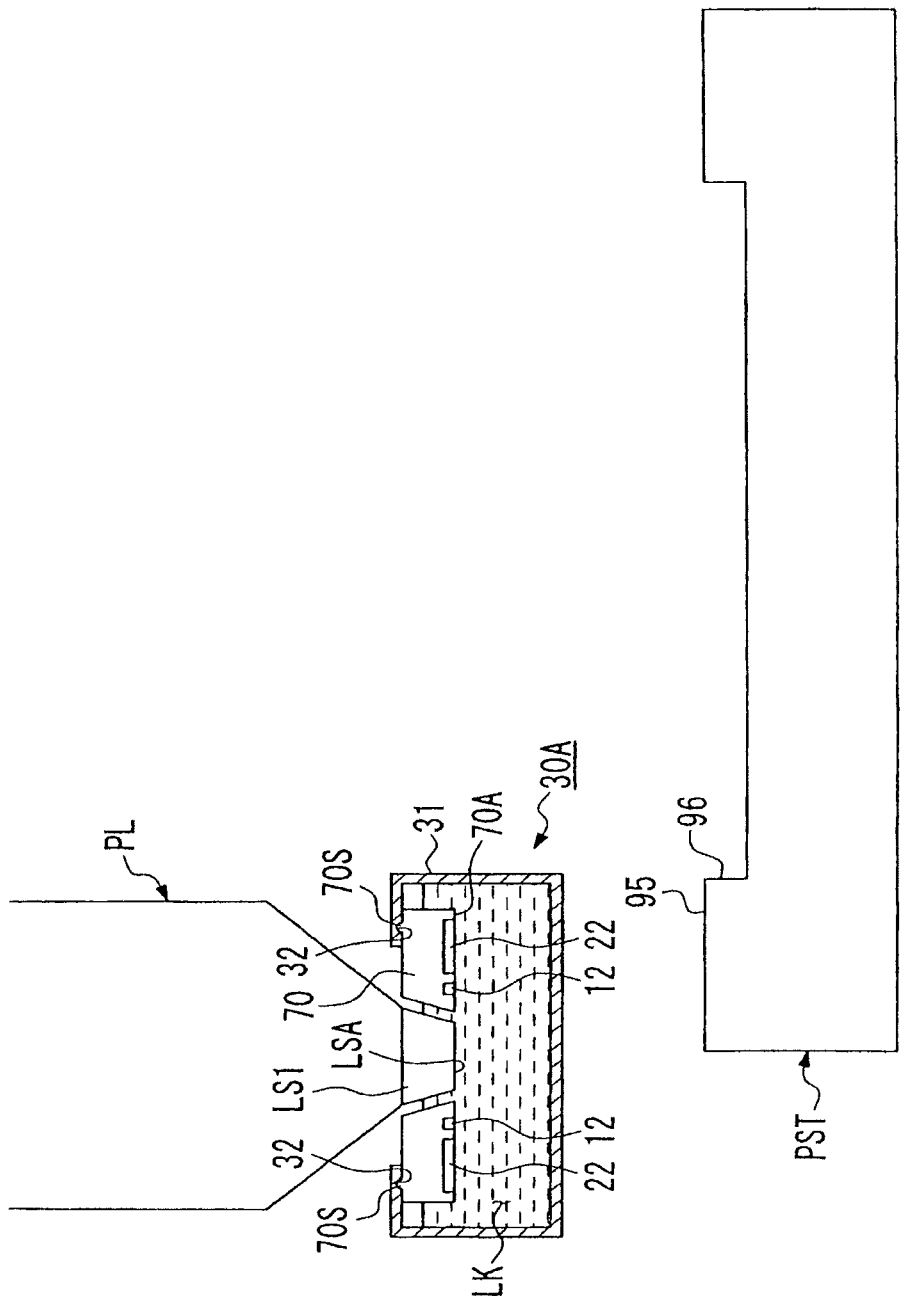
FIG. 3 is a drawing for illustrating a first embodiment of a maintenance device and of a maintenance method.

FIG. 3 is a drawing showing a first embodiment of the maintenance device for maintaining nozzle member 70. Nozzle member 70 is maintained (cleaned) by maintenance device 30A. In FIG. 3, maintenance device 30A is provided with container 31 that is capable of storing cleaning liquid LK. In order to clean nozzle member 70, maintenance device 30A immerses nozzle member 70 in cleaning liquid LK stored in container 31. By immersing nozzle member 70 in cleaning liquid LK stored in container 31 and thus by removing or dissolving the impurities attaching to nozzle member 70, maintenance device 30A cleans nozzle member 70.

By immersing nozzle member 70 in cleaning liquid LK in container 31, undersurface (liquid contact surface) 70A and the side face (or top face) of nozzle member 70 can be cleaned. Furthermore, since by immersing nozzle member 70 in cleaning liquid LK in container 31, cleaning liquid LK flows into supply flow path 14 and recovery flow path 24 respectively via supply ports 12 and collection port 22, the insides of supply flow path 14 and recovery flow path 24 can also be cleaned. Still further, since, in immersing nozzle member 70 in cleaning liquid LK in container 31, by releasing the connection between nozzle member 70 and recovery pipe 23, cleaning liquid LK flows into recovery flow path 24 of nozzle member 70 from both of the flow path's one end side (recovery pipe 23's side) and the other end side (collection port 22's side), the entirety of recovery flow path 24 can be cleaned efficiently. Similarly, by releasing the connection between nozzle member 70 and supply pipe 13, cleaning liquid LK can be made to flow from both of one end side and the other end side of supply flow path 14 of nozzle member 70. In this way, by immersing nozzle member 70 in cleaning liquid LK by using maintenance device 30A provided with container 31, nozzle member 70 can be cleaned well.

In this embodiment, nozzle member 70 is, in a state of being supported by supporting mechanism 140, immersed in cleaning liquid LK stored in 31 (note that supporting mechanism 140 is not shown in FIG. 3). By this, nozzle member 70 can be immersed in cleaning liquid LK, without nozzle member 70 being detached from supporting mechanism 140 (exposure apparatus EX). In other words, since nozzle member 70 can be cleaned without performing nozzle member 70's detaching work and thus also since attaching work after the cleaning (after the maintenance) is not required, the workability of the maintenance operation (cleaning operation) can be improved, which shortens the operation time.

In addition, since nozzle member 70 supported by supporting mechanism 140 is disposed in the vicinity of first optical element LS1, maintenance device 30A can immerse first optical element LS1 along with nozzle member 70. Therefore, the impurities attaching to first optical element LS1 can be removed along with the impurities attaching to nozzle member 70; thus, nozzle member 70 and first optical element LS1 can be cleaned simultaneously and effectively.

Cleaning liquid LK differs from liquid LQ for the liquid immersion exposure, and, in the embodiment, isopropyl alcohol (IPA) is used as cleaning liquid LK. By virtue of the use of IPA, while suppressing adverse influence exerted on nozzle member 70 and first optical element LS1, the impurities attaching to nozzle member 70 and first optical element LS1 can be removed, and thus nozzle member 70 and first optical element LS1 can be cleaned very well.

It is to be noted that cleaning liquid LK can be appropriately selected from among liquids that exert little adverse influence on nozzle member 70 and first optical element LS1 and can remove (resolve) the impurities attaching to nozzle member 70 and first optical element LS1 to clean them. In other words, as cleaning liquid LK, a liquid can be appropriately selected from among such liquids in accordance with the material of nozzle member 70, the material of first optical element LS1, the physical properties of the impurities attaching thereto, etc.

Furthermore, container 31 is formed of a material that does not contaminate cleaning liquid LK. Here, "does not contaminate cleaning liquid LK" means the condition in which it is suppressed that some constituents of container 31 dissolve in cleaning liquid LK. In the embodiment, as the material forming container 31, stainless steel, polytetrafluoroethylene (Teflon (trademark)), or the like can be listed. By this, when cleaning liquid LK is stored in 31, substance dissolution from container 31 in cleaning liquid LK can be prevented, and thus contamination of cleaning liquid LK can be prevented.

In the embodiment, container 31 of maintenance device 30A has connecting portion 32 that is connectable to nozzle member 70. Furthermore, on the top face of nozzle member 70 is provided to-be-connected portion 70S that connects to connecting portion 32 of container 31. With connecting portion 32 and to-be-connected portion 70S being connected to each other, container 31 and nozzle member 70 are connected to each other. Finally, by connecting nozzle member 70 and container 31 to each other via connecting portion 32 and to-be-connected portion 70S, nozzle member 70 and first optical element LS1 are placed inside container 31.

As described above, by immersing nozzle member 70 in cleaning liquid LK stored in container 31, nozzle member 70 can be cleaned. Thus, contamination of liquid LQ that comes into contact with nozzle member 70 can be precluded.

In exposure apparatus EX of the embodiment, it is configured such that liquid LQ recovered by liquid recovery mechanism 20 is returned to liquid supply mechanism 10 via return pipe 27 and that exposure apparatus EX is provided with a circulation system that circulates liquid LQ between liquid supply mechanism 10 and liquid recovery mechanism 20. Thus, it might be configured such that by making cleaning liquid LK flow through the circulation system, the entire flow path of liquid supply mechanism 10 including supply pipe 13, temperature regulation device 17, the water purifying device, etc. and the entire flow path of liquid recovery mechanism 20 including recovery pipe 23, processing device 26, etc. are cleaned. In this case, after making cleaning liquid LK flow through the entire flow paths of liquid supply mechanism 10 and liquid recovery mechanism 20 and before performing a liquid immersion exposure process, it is required that the entirety of cleaning liquid LK in the flow paths of liquid supply mechanism 10 and liquid recovery mechanism 20 be completely substituted by liquid LQ to prevent cleaning liquid LK from being supplied to optical path space K1. However, if cleaning liquid LK is made to flow through the entire flow paths of liquid supply mechanism 10 and liquid recovery mechanism 20, then in order to substitute cleaning liquid LK in the flow paths by liquid LQ, it is required that the supply and recovery operations of liquid LQ by liquid immersion mechanism 1 be performed for a long time, which invites, for example, a disadvantage that decrease of the operation rate of exposure apparatus EX is induced. Furthermore, if cleaning liquid LK flows into liquid supply mechanism 10, then, for example, the water purifying device of liquid supply mechanism 10 may be adversely influenced. Still further, there arises the disadvantage that a large amount of cleaning liquid LK is required to be used. Since it can be considered that, in the flow paths of liquid supply mechanism 10 and liquid recovery mechanism 20, contaminations due to impurities generated from substrate P occur mainly in the vicinity of nozzle member 70's collection port 22, in recovery flow path 24, at nozzle member 70's undersurface 70A, at first optical element LS1's undersurface, etc., it is inefficient to make cleaning liquid LK flow through the entire flow paths of liquid supply mechanism 10 and liquid recovery mechanism 20.

Since, in the embodiment, nozzle member 70 and first optical element LS1, which are considered to be most easily contaminated, are cleaned, the cleaning process can be effectively performed, and thus contamination of liquid LQ with which optical path space K1 is filled can be prevented. Thus, exposure and measurement processes can be executed via liquid LQ that is not contaminated and is in a desired condition.

Figure 4:
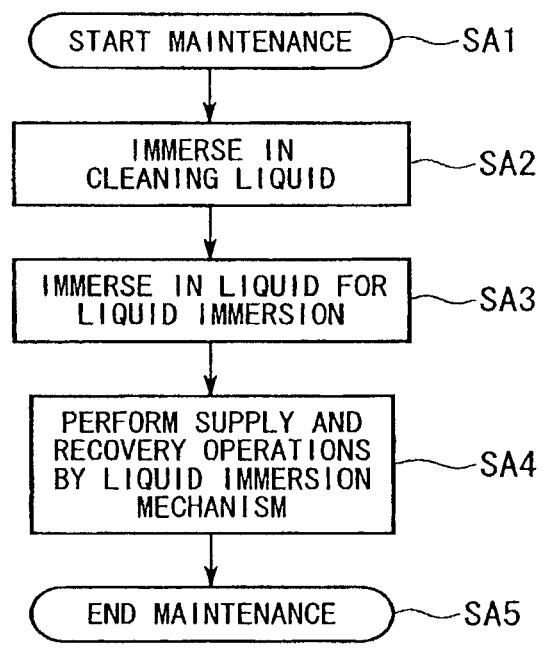
FIG. 4 is a flowchart for illustrating a maintenance method example of the first embodiment.

Next, an example of maintenance procedures will be described referring to the flowchart of FIG. 4. When initiation of the cleaning process using maintenance device 30A is instructed (Step SA1), container 31 storing cleaning liquid LK and nozzle member 70 are connected to each other via connecting portion 32 by, e.g., an operator. By this, nozzle member 70 and first optical element LS1 are immersed in cleaning liquid LK (Step SA2). At this point, as shown in FIG. 3, substrate stage PST has been evacuated to a predetermined evacuation position which is other than the position beneath projection optical system PL.

After immersing nozzle member 70 and first optical element LS1 in cleaning liquid LK for a predetermined period of time, the connection between connecting portion 32 and to-be-connected portion 70S is released. By this, the immersion process on nozzle member 70 and first optical element LS1 by cleaning liquid LK terminates. It should be noted that the above-mentioned "predetermined period of time" is a period of time in which impurities attaching to nozzle member 70 and first optical element LS1 can be sufficiently removed (dissolved) and the predetermined period of time can be determined in advance through, e.g., an experiment.

After immersing nozzle member 70 and first optical element LS1 in cleaning liquid LK, container 31 storing liquid (purified water) LQ for liquid immersion exposure and nozzle member 70 are connected with each other via connecting portion 32 by, e.g., the operator. By doing so, cleaning liquid LK that is remaining on, e.g., nozzle member 70's undersurface 70A or first optical element LS1's undersurface LSA and cleaning liquid LK that is remaining in nozzle member 70's supply flow path 14 or recovery flow path 24 can be removed.

Next, after detaching container 31 from nozzle member 70, controller CONT performs the supply and recovery operations of liquid LQ by liquid immersion mechanism 1 in a state in which first optical element LS1 and nozzle member 70 face substrate stage PST's top face 95 (or a dummy substrate held by substrate holder PH) (Step SA4). In this regard, top face 95 (or the dummy substrate) is preferably formed of a material that does not contaminate liquid LQ. "Does not contaminate liquid LQ" means the condition in which it is suppressed that some constituents of the material forming top face 95 (or the dummy substrate) dissolve in liquid LQ. In the embodiment, as the base substrate forming top face 95 (or the dummy substrate), ceramics are used, and a treatment (surface treatment) by which a partial area in top face 95 is coated with PFA (copolymer of ethylene tetrafluoride ($C_2F_4$) and perfluoroalkoxyethylene) is applied.

By performing the supply and recovery operations of liquid LQ by liquid immersion mechanism 1 for a predetermined period of time, cleaning liquid LK remaining on nozzle member 70's undersurface 70A, first optical element LS1's undersurface LSA, etc. can be more reliably removed, and, at the same time, cleaning liquid LK remaining in nozzle member 70's supply flow path 14, recovery flow path 24, etc. can also be more reliably removed. In this way, after performing the supply and recovery operations of liquid LQ by liquid immersion mechanism 1, the maintenance ends (Step SA5).

It should be noted that in Step SA4, liquid LQ recovered via collection port 22 of nozzle member 70 of liquid immersion mechanism 1 is entirely discharged (discarded) to the outside of exposure apparatus EX via discharge pipe 28. By doing so, even if cleaning liquid LK is mixed in liquid LQ recovered via collection port 22, cleaning liquid LK is prevented from being returned to liquid supply mechanism 10. More specifically, as described above, if cleaning liquid LK flows into liquid supply mechanism 10, then there arise, for example, such disadvantages as the disadvantage that liquid supply mechanism 10's water purifying device is adversely influenced or the disadvantage that during the liquid immersion exposure process performed after completion of the maintenance process, cleaning liquid LK is mixed in liquid LQ supplied from supply ports 12. Thus, by continuing to perform the process of Step SA4, i.e. the supply and recovery operations of liquid LQ by liquid immersion mechanism 1, until the cleaning liquid in nozzle member 70's supply flow path 14 and recovery flow path 24 is completely substituted by liquid LQ, the above-described disadvantages can be prevented.

It should be noted that the judgment as to whether nozzle member 70 has been cleaned well can be made by, after the cleaning process, performing the supply and recovery operations of liquid LQ by liquid immersion mechanism 1, by measuring at least either the properties or constituents (condition of liquid) of, for example, liquid LQ recovered via collection port 22 by use of a measuring instrument, and by basing upon the measurement results therefrom. In this regard, as the measuring instrument, there can be listed, for example, a TOC analyzer, which is capable of measuring total organic carbon (TOC), a particle counter, which is capable of measuring particle bubbles, and a dissolved oxygen analyzer (DO analyzer), which is capable of measuring dissolved oxygen. Of course, the measuring instrument is not limited to the above-mentioned ones, and an instrument that is capable of measuring any one of various kinds of appropriate indices representing the condition of liquid LQ can be used as the measuring instrument. When the measuring instrument's measurement results (measurement values) after the cleaning of nozzle member 70 are found to be improved compared with the measuring instrument's measurement results (measurement values) before the cleaning of nozzle member 70, it can be judged that nozzle member 70 has been cleaned well. In contrast, when the measurement results are found not to be improved, it is only required that the cleaning process using maintenance device 30A be performed again.

<Second Embodiment of Maintenance Device and Method>

Next, a second embodiment of maintenance device and method will be described referring to FIG. 5. In the following description, the same or equivalent constituent elements as those in the above-described embodiment will be denoted by the same numeral or letter, and their descriptions will be omitted.

Figure 5:
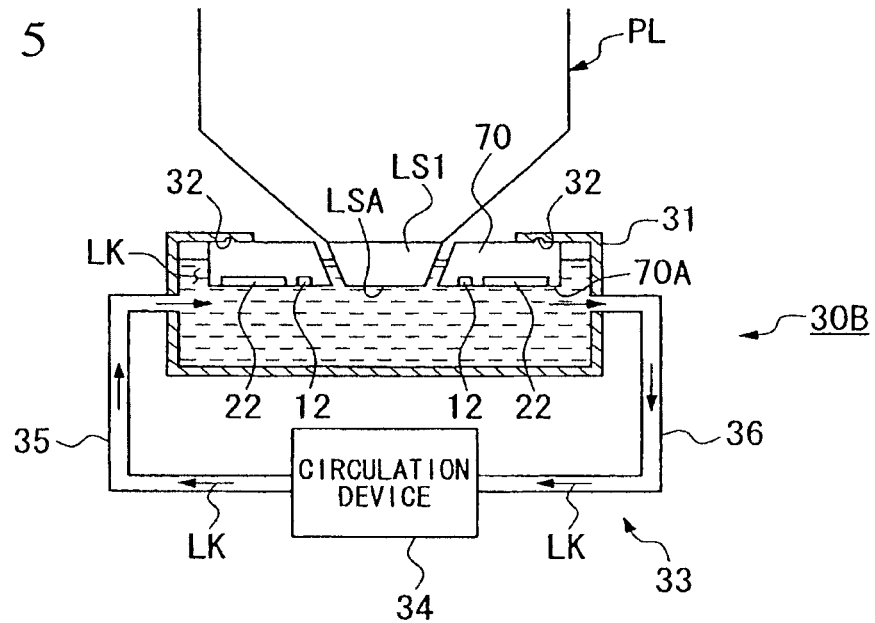
FIG. 5 is a drawing for illustrating a second embodiment of a maintenance device and of a maintenance method.

In FIG. 5, while circulating cleaning liquid LK by circulation system 33 including container 31, maintenance device 30B immerses nozzle member 70 and first optical element LS1 in cleaning liquid LK. Circulation system 33 is provided with circulation device 34 that includes a pump etc. and supplies cleaning liquid LK to container 31 via supply pipe 35, and cleaning liquid LK in container 31 is returned to circulation device 34 via recovery pipe 36. Furthermore, circulation device 34 has a function of adding new (clean) cleaning liquid LK and supplying it to container 31.

As with the first embodiment, when cleaning nozzle member 70 and first optical element LS1, container 31 storing cleaning liquid LK and nozzle member 70 are connected to each other via connecting portion 32. By this, nozzle member 70 and first optical element LS1 are immersed in cleaning liquid LK. Next, maintenance device 30B drives circulation device 34. By this, cleaning liquid LK is circulated through circulation system 33 including container 31. Circulation device 34 has the function of adding new (clean) cleaning liquid LK, and thus, by discharging (discarding) to the outside of maintenance device 30B a portion of cleaning liquid LK having been returned via recovery pipe 36 and, at the same time, by circulating cleaning liquid LK while adding new (clean) cleaning liquid LK, maintenance device 30B can clean (immerse) nozzle member 70 and first optical element LS1 always with (in) clean cleaning liquid LK. It is to be noted that it may also be configured such that by providing circulation device 34 with a function of making liquid LK returned via recovery pipe 36 clean, the portion of cleaning liquid LK having been returned via recovery pipe 36 is not discharged, but reused.

Furthermore, it may also be configured such that when the immersion process (cleaning process) of nozzle member 70 and first optical element LS1 is being performed by using maintenance device 30B, only liquid recovery mechanism 20 (liquid recovery portion 21) of liquid immersion mechanism 1 is driven to recover cleaning liquid LK in container 31 via collection port 22 of nozzle member 70. After flowing through recovery flow path 24 of nozzle member 70, cleaning liquid LK recovered (sucked) via collection port 22 flows through recovery pipe 23 and is then recovered into liquid recovery portion 21. At this time, liquid recovery portion 21 discards the entirety of the recovered cleaning liquid LK via discharge pipe 28. By doing so, the flow paths of liquid recovery mechanism 20 (recovery flow path 24, recovery pipe 23, etc.) are cleaned by cleaning liquid LK, and cleaning liquid LK is not supplied (returned) to liquid supply mechanism 10. Thus, nozzle member 70's recovery flow path 24 and recovery pipe 23 that with liquid LQ which has come into contact with substrate P and includes impurities flowing therethrough, are likely to have been contaminated can be cleaned well, and, at the same time, adverse influence of cleaning liquid LK on liquid supply mechanism 10 can be precluded.

After immersing nozzle member 70 and first optical element LS1 in cleaning liquid LK for a predetermined time period and detaching container 31 storing cleaning liquid LK from nozzle member 70, container 31 storing liquid (purified water) LQ for liquid immersion exposure and nozzle member 70 are connected to each other via connecting portion 32, as with in the case of the first embodiment. By this nozzle member 70 and first optical element LS1 are immersed in liquid LQ. Next, maintenance device 30B drives circulation device 34. Circulation device 34 of this instance has a function of adding new (clean) liquid (purified water) LQ and supplying it to container 31, and liquid LQ is circulated in circulation system 33 including container 31. Circulation device 34 has the function of adding new (clean) liquid (purified water) LQ, and thus, by discharging (discarding) a portion of liquid (water) LQ having been returned via recovery pipe 36 to the outside of maintenance device 30B and, at the same time, by circulating liquid LQ while adding new (clean) liquid (purified water) LQ, can clean (immerse) nozzle member 70 and first optical element LS1 always with (in) clean liquid LQ. It is to be noted that it may also be configured such that by providing circulation device 34 with a function of making liquid LQ returned via recovery pipe 36 clean, the portion of liquid LQ having been returned via recovery pipe 36 is not discharged, but reused.

By doing so, cleaning liquid LK that is remaining on, e.g., nozzle member 70's undersurface 70A or first optical element LS1's undersurface LSA and cleaning liquid LK that is remaining in nozzle member 70's supply flow path 14 or recovery flow path 24 can be removed.

Furthermore, in the case where at the time of an immersion process (cleaning process) using cleaning liquid LK, the immersion process (cleaning process) using cleaning liquid LK and the operation of recovering cleaning liquid LK in container 31 via collection port 22 have been simultaneously performed, and the recovered cleaning liquid LK has been entirely discharged via discharge pipe 28, similar operations are preferably performed also at the time of an immersion process (cleaning process) using liquid LQ performed thereafter. More specifically, after the immersion process (cleaning process) using cleaning liquid LK, the immersion process (cleaning process) using liquid LQ and the operation of recovering liquid LQ in container 31 via collection port 22 are simultaneously performed, and the recovered liquid LQ is entirely discharged via discharge pipe 28. By doing so, cleaning liquid LK remaining in recovery pipe 23, etc. can be removed, and, at the same time, the disadvantage that cleaning liquid LK would be supplied to liquid supply mechanism 10 can be precluded.

Next, as with in the case of the first embodiment, after detaching container 31 from nozzle member 70, controller CONT performs the supply and recovery operations of liquid LQ by liquid immersion mechanism 1 in a state in which projection optical system PL and nozzle member 70 face substrate stage PST's top face 95 (or a dummy substrate). By doing so, cleaning liquid LK remaining at nozzle member 70's undersurface 70A, first optical element LS1's undersurface LSA, nozzle member 70's supply flow path 14, recovery flow path 24, etc. can be more reliably removed. In this case also, by performing, for a predetermined time period, the operation of discharging (discarding), to the outside of exposure apparatus EX via discharge pipe 28, the entirety of liquid LQ having been recovered via collection port 22 of nozzle member 70 of liquid immersion mechanism 1, returning of cleaning liquid LK to liquid supply mechanism 10 can be prevented, even if cleaning liquid LK is mixed in liquid LQ recovered via collection port 22.

<Third Embodiment of Maintenance Device and Method>

Figure 6:
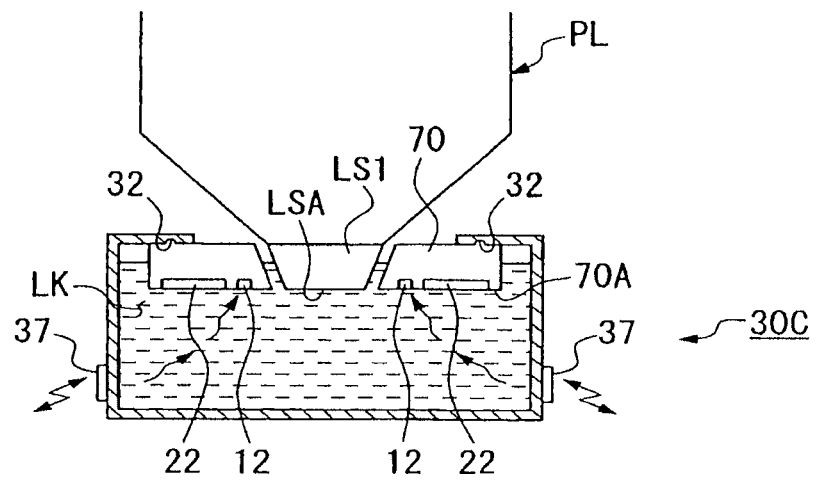
FIG. 6 is a drawing for illustrating a third embodiment of a maintenance device and of a maintenance method.

Next, a third embodiment of maintenance device and method will be described referring to FIG. 6. Maintenance device 30C shown in FIG. 6 is provided with ultrasonic transducer (ultrasonic generator) 37 which applies ultrasonic waves to cleaning liquid LK in container 31. Ultrasonic transducer 37 is attached to a predetermined position on container 31. In the example shown in FIG. 6, ultrasonic transducer 37 is attached on the outer side surface of container 31. As ultrasonic transducer 37, for example, a transducer of piezoelectric device type or of electromagnetic type may be used. By vibrating (applying ultrasonic waves to) container 31, ultrasonic transducer 37 applies ultrasonic waves to cleaning liquid LK in container 31 to expedite the removal (dissolution) of impurities attaching to nozzle member 70, first optical element LS1, etc. As with the above-described embodiments, on completion of the immersion process by cleaning liquid LK, the immersion process by liquid LQ, the supply and recovery operations of liquid LQ by liquid immersion mechanism 1 in a state in which nozzle member 70 and first optical element LS1 face substrate stage PST's top face 95 (or a dummy substrate), etc. are performed.

It should be noted that the operation of applying ultrasonic waves to cleaning liquid LK in container 31 and such an operation of circulating cleaning liquid LK by using circulation system 33 as is performed in the second embodiment may be simultaneously performed. By doing so, the removal (dissolution) of impurities attaching to nozzle member 70, first optical element LS1, etc. can be still further expedited.

<Fourth Embodiment of Maintenance Device and Method>

Figure 7:
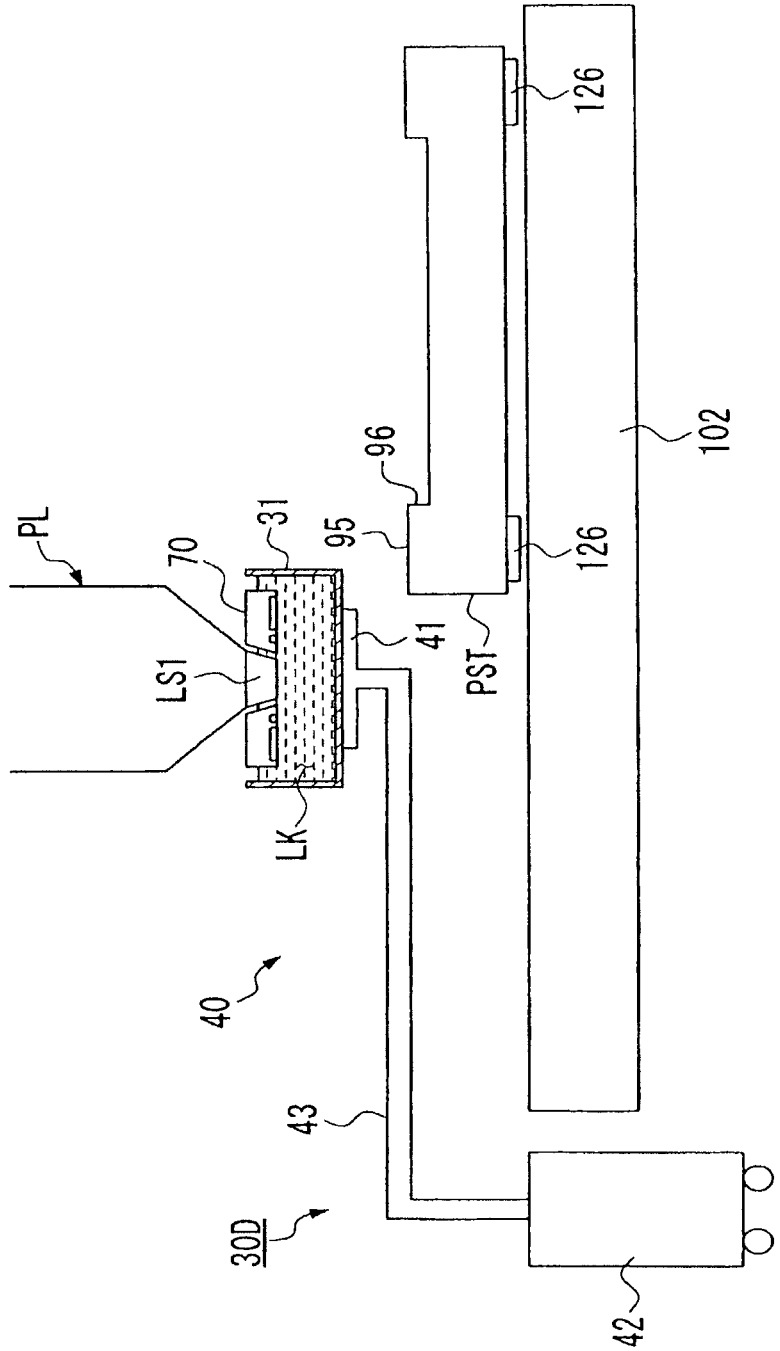
FIG. 7 is a drawing for illustrating a fourth embodiment of a maintenance device and of a maintenance method.

Next, a fourth embodiment of maintenance device and method will be described referring to FIG. 7. Maintenance device 30D shown in FIG. 7 is provided with supporting device 40 that movably supports container 31. Supporting device 40 is capable of moving container 31 between the inside and the outside of exposure apparatus EX and is provided with supporting table 41 that supports container 31 and with connecting member 43 that connects supporting table 41 and carriage 42 to each other. Supporting table 41 is supported by one end of connecting member 43, and the other end of connecting member 43 is connected to carriage 42. It is to be noted that it may also be configured such that by providing a driving mechanism between supporting table 41 and the one end of connecting member 43, supporting table 41 is made to be movable in the X-axis-, Y-axis-, and Z-axis directions.

When performing a cleaning process by using maintenance device 30D, maintenance device 30D is conveyed to the vicinity of exposure apparatus EX by, e.g., an operator. Since maintenance device 30D has carriage 42, the operator can easily convey maintenance device 30D. Next, supporting table 41 supported by the one end of connecting member 43 and container 31 disposed on supporting table 41 are placed in a position beneath nozzle member 70 and first optical element LS1. At this point, substrate stage PST has been evacuated to a predetermined evacuation position which is other than the position beneath projection optical system PL. Subsequently, maintenance device 30D immerses nozzle member 70 and first optical element LS1 in cleaning liquid LK stored in container 31 supported on supporting table 41. In this embodiment, container 31 and nozzle member 70 are not connected to each other; container 31 is positioned by supporting device 40 in a predetermined positional relationship with nozzle member 70 and first optical element LS1, and, in this state, the immersion process is performed. As with the above-described embodiments, on completion of the immersion process by cleaning liquid LK, the immersion process by liquid LQ, the supply and recovery operations of liquid LQ by liquid immersion mechanism 1 in a state in which nozzle member 70 and first optical element LS1 face substrate stage PST's top face 95 (or a dummy substrate), etc. are performed.

It should be noted that container 31 supported by supporting device 40 may be provided with circulation system 33, as in the second embodiment, or may be attached with ultrasonic transducer 37, as in the third embodiment.

<Fifth Embodiment of Maintenance Device and Method>

Figure 8:
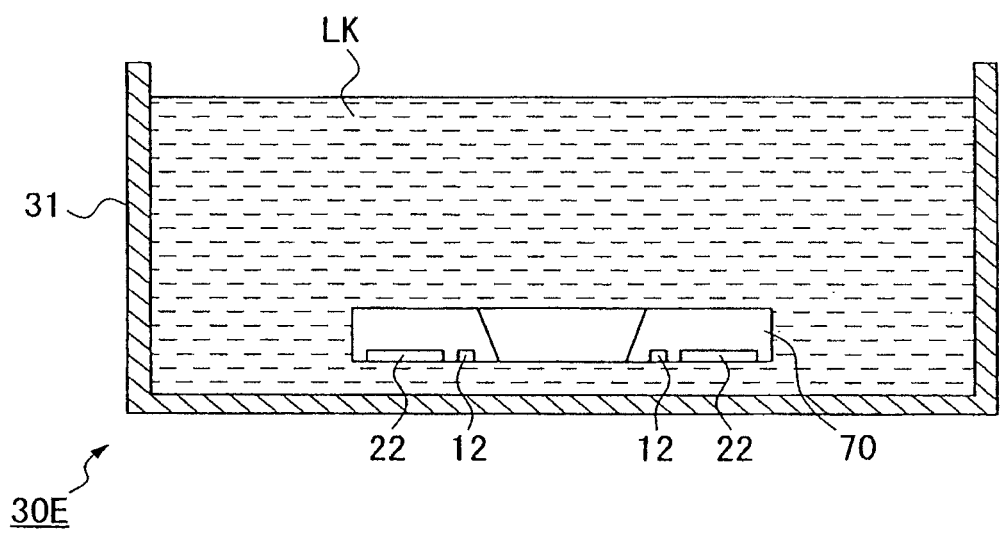
FIG. 8 is a drawing for illustrating a fifth embodiment of a maintenance device and of a maintenance method.

Next, a fifth embodiment of maintenance device and method will be described referring to FIG. 8. While, in the above-described first to fourth embodiments, nozzle member 70 is immersed in cleaning liquid LK in a state that nozzle member 70 is supported by supporting mechanism 140, the characterizing portion of this embodiment lies in that nozzle member 70 is detached from supporting mechanism 140 (exposure apparatus EX) and then is immersed in cleaning liquid LK in container 31. In other words, maintenance device 30E of the embodiment performs the immersion process of nozzle member 70 outside exposure apparatus EX. After the immersion process by cleaning liquid LK is completed and before nozzle member 70 is connected to supporting mechanism 140, nozzle member 70 is placed in container 31 storing liquid LQ to immerse nozzle member 70 in liquid LQ. By this, cleaning liquid LK remaining in nozzle member 70 is removed. And, after cleaning liquid LK remaining in nozzle member 70 is sufficiently removed, connecting operation between the nozzle member and supporting mechanism 140 is performed.

Since, with the immersion process of nozzle member 70 being performed with nozzle member 70 being detached from supporting mechanism 140 (exposure apparatus EX), cleaning liquid LK flows into recovery flow path 24 of nozzle member 70 from both of one end side (recovery pipe 23's side) and the other end side (collection port 22's side), the entirety of recovery flow path 24 can be efficiently cleaned. Similarly, cleaning liquid LK can be made to flow into supply flow path 14 from both of one end side and the other end side. Thus, nozzle member 70 can be cleaned well.

In addition, with the immersion process of nozzle member 70 being performed with nozzle member 70 being detached from supporting mechanism 140 (exposure apparatus EX), first optical element LS1 is not influenced by cleaning liquid LK. Since, thus, without considering the material etc. of first optical element LS1, most suitable cleaning liquid LK in accordance with the material of nozzle member 70 and with impurities attaching to nozzle member 70 etc. can be chosen, the cleaning can be performed well.

It should be noted that in the case where when the immersion process of nozzle member 70 has been performed with nozzle member 70 being detached from supporting mechanism 140 (exposure apparatus EX), it is judged whether nozzle member 70 has been cleaned well, measurement of the contact angle of nozzle member 70 relative to liquid LQ works effectively. For example, when judging whether the cleaning of undersurface 70A etc. of nozzle member 70 has been performed well, after completion of the cleaning of nozzle member 70 and before connecting nozzle member 70 to supporting mechanism 140, liquid LQ's contact angle on the surface of nozzle member 70 is measured. When the cleaning has been performed well, and impurities have been sufficiently removed, the contact angle becomes smaller, i.e., the affinity (lyophilicity) of nozzle member 70 relative to liquid LQ increases.

<Sixth Embodiment of Maintenance Device and Method>

Next, a sixth embodiment of maintenance device and method will be described referring to FIG. 9. In this embodiment, there will be described a case where after detaching nozzle member 70 from supporting mechanism 140 (exposure apparatus EX), as in the above-described fifth embodiment, recovery pipe 23 is maintained (cleaned).

Figure 9:
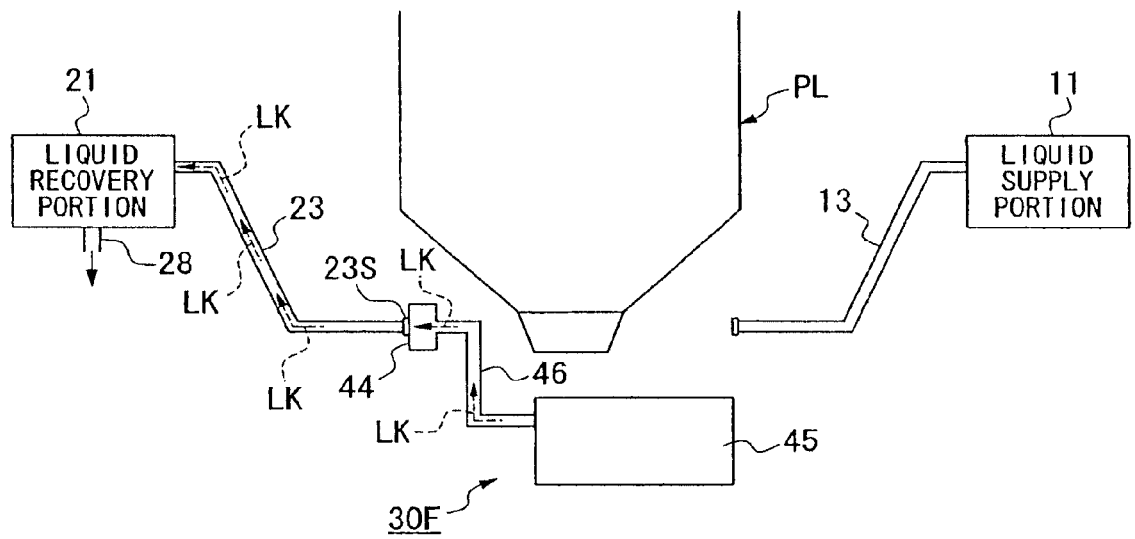
FIG. 9 is a drawing for illustrating a sixth embodiment of a maintenance device and of a maintenance method.

As shown in FIG. 9, when nozzle member 70 is detached from supporting mechanism 140 (exposure apparatus EX), recovery pipe 23's connecting portion 23S that connect to nozzle member 70 is exposed. In the embodiment, after nozzle member 70 is detached from supporting mechanism 140, recovery pipe 23 is cleaned by connecting recovery pipe 23's connecting portion 23S to maintenance device 30F.

Maintenance device 30F of the embodiment is provided with connecting portion 44 that is connectable with recovery pipe 23's connecting portion 23S, with cleaning liquid supply portion 45 that is capable of supplying cleaning liquid LK, and with connecting pipe 46 that connect cleaning liquid supply portion 45 to connecting portion 44. When cleaning recovery pipe 23, maintenance device 30F delivers cleaning liquid LK from cleaning liquid supply portion 45. Cleaning liquid LK having been delivered from cleaning liquid supply portion 45 flows into recovery pipe 23 via connecting pipe 46 and connecting portion 44. When cleaning liquid supply portion 45 is delivering cleaning liquid LK, liquid recovery portion 21 is also being driven. Thus, cleaning liquid LK having flowed into recovery pipe 23 from connecting portion 23S smoothly flows through recovery pipe 23. With cleaning liquid LK flowing through recovery pipe 23, recovery pipe 23 is cleaned. Cleaning liquid LK that has flowed into recovery pipe 23 from connecting portion 23S and has reached liquid recovery portion 21 is discharged from discharge pipe 28. After recovery pipe 23 has been cleaned by cleaning liquid LK, maintenance device 30F supplies liquid LQ to recovery pipe 23. At this point also, liquid recovery portion 21 is being driven. By this, cleaning liquid LK remaining in recovery pipe 23 can be removed by liquid LQ.

Since liquid LQ including impurities generated from substrate P etc. flows in recovery pipe 23, recovery pipe 23 is also likely to be contaminated, as with nozzle member 70. By, after detaching nozzle member 70 from supporting mechanism 140 (exposure apparatus EX), making cleaning liquid LK flow through recovery pipe 23, as is performed in the embodiment, recovery pipe 23 can be cleaned well.

<Seventh Embodiment of Maintenance Device and Method>

Figure 10:
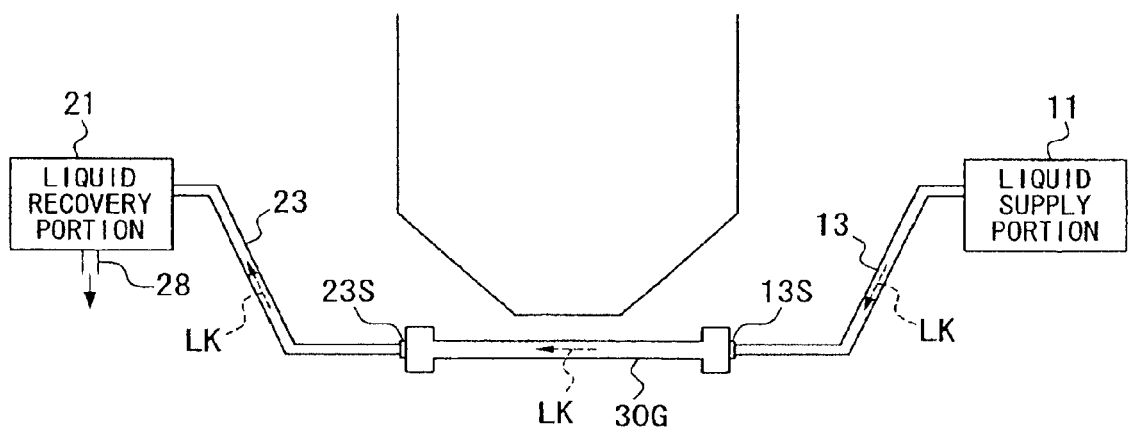
FIG. 10 is a drawing for illustrating a seventh embodiment of a maintenance device and of a maintenance method.

Next, a seventh embodiment of maintenance device and method will be described referring to FIG. 10. As shown in FIG. 10, when nozzle member 70 is detached from supporting mechanism 140 (exposure apparatus EX), recovery pipe 23's connecting portion 23S, which connects to nozzle member 70, and supply pipe 13's connecting portion 13S that connects to nozzle member 70 are exposed. Thus, in this embodiment, after nozzle member 70 is detached from supporting mechanism 140, recovery pipe 23 is cleaned by connecting supply pipe 13's connecting portion 13S to recovery pipe 23's connecting portion 23S by using maintenance device 30G.

Maintenance device 30G of the embodiment includes a connecting pipe that connects supply pipe 13's connecting portion 13S to recovery pipe 23's connecting portion 23S. In this regard, liquid supply portion 11 of the embodiment has a function of supplying cleaning liquid LK, and when recovery pipe 23 is cleaned, cleaning liquid LK is delivered from liquid supply portion 11. Cleaning liquid LK having been delivered from liquid supply portion 11 flows through supply pipe 13 and then flows into recovery pipe 23 via connecting pipe (maintenance device) 30G. When liquid supply portion 11 is delivering cleaning liquid LK, liquid recovery portion 21 is also being driven. Thus, cleaning liquid LK that has flowed through supply pipe 13 and connecting pipe 30G and has flowed into recovery pipe 23 from connecting portion 23S smoothly flows through recovery pipe 23. With cleaning liquid LK flowing through recovery pipe 23, recovery pipe 23 is cleaned. Cleaning liquid LK that has flowed into recovery pipe 23 from connecting portion 23S and has reached liquid recovery portion 21 is discharged from discharge pipe 28. After recovery pipe 23 has been cleaned by cleaning liquid LK, liquid supply portion 11 delivers liquid LQ. At this point also, liquid recovery portion 21 is being driven. By this, cleaning liquid LK remaining in supply pipe 13, recovery pipe 23, etc. can be removed by liquid LQ.

Other Embodiments

It should be noted that while, in the above-described first to third embodiments, container 31 has connecting portion 32, which connects to nozzle member 70, it may also be configured, for example, such that with a connecting portion being provided to container 31 that is connectable with substrate stage PST, nozzle member 70 and first optical element LS1 are immersed in cleaning liquid LK (or liquid LQ) in container 31, in a state that container 31 is connected to substrate stage PST. Furthermore, it may also be configured such that with container 31 being connected with a predetermined device or member in exposure apparatus EX which is other than substrate stage PST, nozzle member 70 and first optical element LS1 are immersed in cleaning liquid LK (or liquid LQ) in container 31.

Furthermore, while, in the above-described first to fourth embodiments, the immersion process is performed by using a single kind of cleaning liquid LK, the immersion process may also be performed by using a plurality of cleaning liquids. For example, it may be configured such that nozzle member 70 and first optical element LS1 are immersed in a first cleaning liquid stored in the container and, thereafter, are immersed in a second cleaning liquid stored in the container. In this case, for example, it may be configured such that as the first cleaning liquid, a liquid which is in accordance with the material of nozzle member 70 is used, and as the second cleaning liquid, a liquid which is in accordance with the material of first optical element LS1 is used. More specifically, when a predetermined (single kind of) cleaning liquid is used, there may arise such a possibility that depending on the materials of nozzle member 70 and first optical element LS1, while impurities attaching to nozzle member 70 can be removed, impurities attaching to first optical element LS1 cannot be removed well. In such a case, by separately using cleaning liquids in accordance with each of the materials of nozzle member 70 and first optical element LS1, each of nozzle member 70 and first optical element LS1 can be cleaned well. Furthermore, thereafter, immersing them in liquid (purified water) LQ for liquid immersion exposure, as described above, would suffice.

Furthermore, also in the fifth embodiment, successive immersion processes may be performed by using each of multiple kinds of cleaning liquids. In addition, in the fifth embodiment also, container 31 may be provided with circulation system 33 or may be attached with ultrasonic transducer 37. Still further, in the sixth and seventh embodiments also, it may be configured such that multiple kinds of cleaning liquids are made to flow through recovery pipe 23.

It should be noted that while, in the above-described first to seventh embodiments, IPA is used as cleaning liquid LK in order to remove mainly the impurities due to photosensitive material 3, oxygenated water may be used, or, depending on impurities, impurities may be removed from nozzle member 70, first optical element LS1, etc. by immersing them in liquid LQ (purified water) for a predetermined time period. In such latter case, as cleaning liquid LK, the same liquid LQ as that for liquid immersion exposure may be used. In also the case where liquid (water) LQ is used as cleaning liquid LK, by, for example, attaching ultrasonic transducer 37 to container 31 and by applying ultrasonic waves to liquid LQ, as described above, impurities can be removed from nozzle member 70, first optical element LS1, etc.

It should be noted that, in the above-described first to fifth embodiments, while performing temperature regulation of nozzle member 70, first optical element LS1, etc., the immersion process by cleaning liquid LK may be performed. Cleaning liquid LK in those embodiments is IPA, and the temperature of nozzle member 70, first optical element LS1, etc. may change due to, e.g., the vaporization heat of cleaning liquid LK. When the temperature change amount is significant, nozzle member 70, first optical element LS1, etc. may thermally deform, adversely influencing the exposure accuracy and the measurement accuracy. Thus, it is preferable that the immersion process be performed while performing by a predetermined temperature regulation device temperature regulation of nozzle member 70, first optical element LS1, etc. so that the temperature change of nozzle member 70, first optical element LS1, etc. due to the vaporization heat of cleaning liquid LK is cancelled. Furthermore, it may also be configured such that while regulating the temperature of cleaning liquid LK and/or liquid LQ, the immersion process is performed. Similarly, it may also be configured such that, also in the sixth and seventh embodiments, while performing the temperature regulation of recovery pipe 23 and/or supply pipe 13, cleaning liquid LK is made to flow therethrough.

It should be noted that while, in the above-described first to fifth embodiments, the description has been made assuming that immersion portion (container) 31, which immerses nozzle member 70, first optical element LS1, etc. in cleaning liquid LK (or liquid LQ), is provided to the maintenance device, which is separate from exposure apparatus EX, container 31 may be made to be a portion of exposure apparatus EX. For example, it may be configured such that by providing container 31 on the side face of substrate stage PST or by providing container 31 to a predetermined movable member that is movable in the image plane side of projection optical system PL and is other than substrate stage PST, nozzle member 70, first optical element LS1, etc. are subjected to the immersion process (cleaning process).

Furthermore, while, in the above-described first to fifth embodiments, the case where nozzle member 70, first optical element LS1, etc. are cleaned has been described, the cleaning method (maintenance method) of each of the above-described embodiments can be applied when various kinds of members that come into contact with liquid LQ and are contaminated with impurities are to be cleaned. For example, when liquid LQ on substrate P scatters and attaches to the off-axis type alignment system or the focus-leveling detection system, each of which is disposed alongside of projection optical system PL, and the alignment system, the focus-leveling detection system, etc. are contaminated, the alignment system, the focus-leveling detection system, etc. may be immersed in cleaning liquid LK.

In the above-described embodiments, the cleaning (maintaining) operation of nozzle member 70 etc. may be performed periodically or may be performed when nozzle member 70 etc. are determined to be contaminated based on the measurement results obtained by measuring the water quality of liquid LQ having passed through nozzle member 70 etc. by using the above-described measuring instrument.

It is to be noted that while, in the above-described embodiments, description has been made on the cleaning of the first optical element, the nozzle member, etc. attached to exposure apparatus EX or on the cleaning of the nozzle member detached from exposure apparatus EX, the above-described cleaning operation may also be applied to the nozzle member etc. in the production process when the nozzle member etc. are not yet attached to the exposure apparatus.

Still further, the cleaning operation associated with the present invention is not limited to the cleaning operation using cleaning liquid LK, e.g., IPA, in the above-described embodiments, but it may also be performed in cooperation with, e.g., a UV-cleaning (photochemical cleaning) operation or a chemical cleaning operation of various kinds.

As described above, in the embodiments, liquid LQ is purified water. Purified water has the advantage that it is easily available in bulk in, e.g., semiconductor manufacturing factories and also the advantage that it does not adversely affect photoresist on substrate P, optical elements (lenses), etc. Furthermore, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory, it may be configured such that the exposure apparatus itself has an ultrapure water system.

The refractive index n of purified water (water) relative to exposure light EL having a wavelength of about 193 nm is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Furthermore, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

In the embodiments, optical element LS1 is attached to the end of projection optical system PL, and by this lens, the optical characteristics of projection optical system PL (spherical aberration, coma aberration, etc.) can be adjusted. It should be noted that as the optical element to be attached to the end of projection optical system PL, an optical plate used for the adjustment of the optical characteristics of projection optical system PL may be utilized. Alternatively, a plane parallel plate that can transmit exposure light EL may be utilized.

It should be noted that if the pressure, caused by the flow of liquid LQ, of the space between the optical element located at the end of projection optical system PL and substrate P is high, it may be configured such that the optical element is rigidly fixed so as not to move due to the pressure, instead of making the optical element replaceable.

It should be noted that while, in the embodiments, it is configured such that the space between projection optical system PL and the surface of substrate P is filled with liquid LQ, it may also be configured, for example, such that the space is filled with liquid LQ in the condition that a cover glass constituted by a plane parallel plate is attached to the surface of substrate P.

Furthermore, it should be noted that while in the projection optical system of the above-described embodiments, the image plane side optical path space on the optical element located at the end of the projection optical system is filled with the liquid, a projection optical system in which the mask side optical path space on the optical element located at the end of the projection optical system is also filled with a liquid, as disclosed in the PCT International Publication WO 2004/019128, may be adopted.

It should be noted that while, in the embodiments, liquid LQ is water (purified water), liquid LQ may be a liquid other than water. For example, when the light source of exposure light EL is an $F_2$ laser, the $F_2$ laser light beam does not transmit through water, and thus, as liquid LQ, a fluorofluid that can transmit the $F_2$ laser light beam, such as perfluoropolyether (PFPE) or fluorochemical oil, may be used. In this case, the portions that come into contact with liquid LQ are applied with lyophilic treatment, by forming a thin film of a substance which includes, e.g., fluorine and has a molecular structure of a small polarity. Furthermore, as liquid LQ, a material (e.g., cedar oil) that can transmit exposure light EL, has a high refractive index as high as practicable, and does not affect projection optical system PL and the photoresist applied to the surface of substrate P can also be used. Also in this case, the surface treatment is applied in accordance with the polarity of liquid LQ to be used.

It should be noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used.

Furthermore, regarding exposure apparatus EX, the present invention can be applied to an exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element). In this case, the present invention can be applied to a stitch type one-shot exposure apparatus in which thereafter, in the state that a second pattern and substrate P are substantially stationary, the reduction image of the second pattern is exposed at one time onto substrate P by using the projection optical system in a manner that the first pattern image and the second pattern image partially overlap with each other. Furthermore, in conjunction with the stitch type exposure apparatus, the present invention can also be applied to a step-and-stitch type exposure apparatus in which at least two patterns are transferred onto substrate P in a partially overlapping manner, and substrate P is successively moved.

Furthermore, the present invention can also be applied to a twin stage type exposure apparatus which is disclosed in, e.g., Japanese Unexamined Patent Publication No. H10-163099, Japanese Unexamined Patent Publication No. H10-214783, and Published Japanese Translation No. 2000-505958 of the PCT International Publication. In a twin stage type exposure apparatus, a predetermined region for preventing the contamination of the liquid LQ can be formed on the upper surface of at least one of the two stages, which hold a substrate.

Furthermore, while, in the above-described embodiments, the exposure apparatus, in which the liquid locally fills the space between projection optical system PL and substrate P, is adopted, the present invention can also be applied to a liquid immersion exposure apparatus in which the entire surface of a substrate to be exposed is immersed in a liquid, as disclosed in, e.g., Japanese Unexamined Patent Publication No. H06-124873, Japanese Unexamined Patent Publication No. H10-303114, or U.S. Pat. No. 5,825,043.

Regarding the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices (CCDs), and an exposure apparatus for manufacturing reticles or masks.

When using a linear motor (see U.S. Pat. No. 5,623,853 or U.S. Pat. No. 5,528,118) in substrate stage PST and/or mask stage MST, either air-cushion type linear motor using an air bearing or a magnetic levitation type linear motor using a Lorentz force or reactance force may be used. Furthermore, substrate stage PST may be either of a type moving along a guide or of a guideless type having no guide.

As the driving mechanism for substrate stage PST and/or mask stage MST, a planar motor in which by making a magnet unit in which magnets are two-dimensionally arranged and an armature unit in which coils are two-dimensionally arranged face each other, each of substrate stage PST and mask stage MST is driven by an electromagnetic force may be used. In this case, either one of the magnet unit and the armature unit is attached to stage PST or stage MST, and the other unit is attached to the moving surface side of stage PST or stage MST.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

Figure 11:
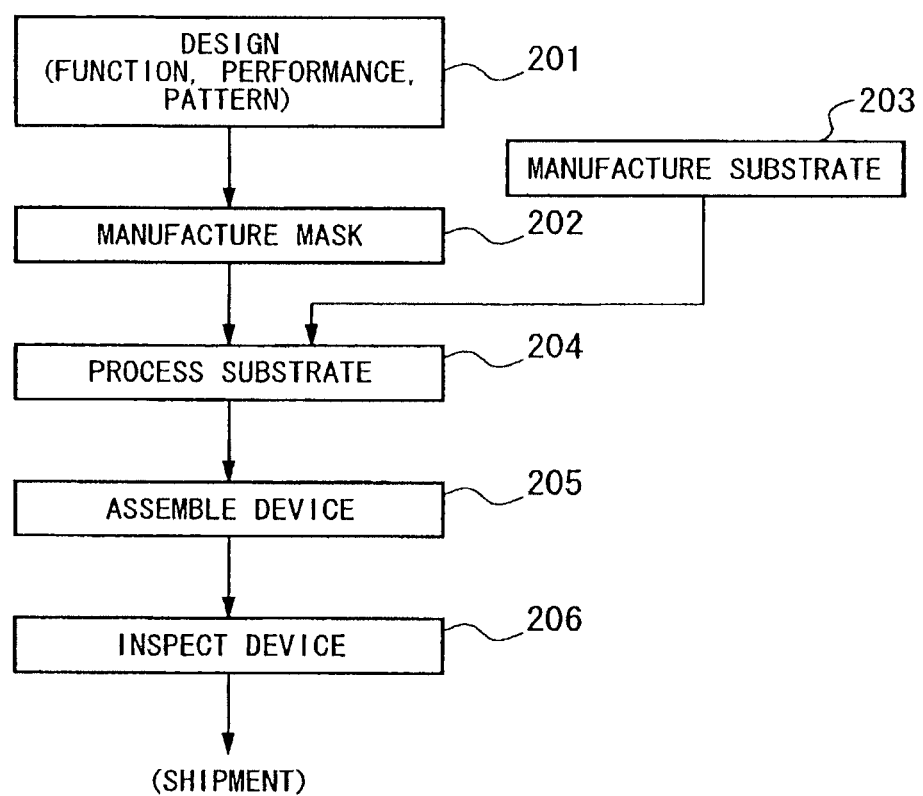
FIG. 11 is a flowchart showing an example of a microdevice manufacturing process.

As shown in FIG. 11, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate processing step 204 including a process in which the mask pattern is exposed onto the substrate by exposure apparatus EX according to the above-described embodiments; device assembly step 205 (including a dicing process, a bonding process, and a packaging process); inspection step 206.

The invention claimed is:

1. A maintenance method for a liquid immersion exposure apparatus in which a substrate is exposed through water during an exposure operation, the method comprising:
   cleaning a nozzle member with a cleaning liquid during a cleaning operation;
   after cleaning the nozzle member with the cleaning liquid, supplying water from a supply opening of the nozzle member to at least one of an upper surface of a stage and an upper surface of a dummy substrate and collecting the supplied water from at least one of the upper surface of the stage and the upper surface of the dummy substrate via a collection opening of the nozzle member; and
   measuring at least either a property or a constituent of the water collected via the collection opening of the nozzle member,
   wherein the nozzle member is cleaned with the cleaning liquid while the nozzle member is detached from the liquid immersion exposure apparatus.

2. The method of claim 1, wherein a result of the cleaning operation is judged based on a result of the measuring.

3. The method of claim 1, wherein the at least either the property or the constituent of the collected water includes total organic carbon.

4. The method of claim 1, wherein the at least either the property or the constituent of the collected water is measured by a measuring instrument which includes a particle counter.

5. The method of claim 1, wherein the cleaning liquid is disposed in a container and the nozzle member is cleaned with the cleaning liquid disposed in the container.

6. The method of claim 5 wherein the cleaning liquid is circulated when the nozzle member is cleaned with the cleaning liquid disposed in the container.

7. The method of claim 5 wherein ultrasonic waves are applied to the cleaning liquid when the nozzle member is cleaned with the cleaning liquid.

8. The method of claim 1 wherein the cleaning of the nozzle member with the cleaning liquid is performed in cooperation with a UV-cleaning or a chemical cleaning.

9. The method of claim 1, wherein the stage is a substrate stage arranged such that the substrate is held on the substrate stage during the exposure operation.

10. The method of claim 1, wherein the dummy substrate is held on a substrate stage arranged such that the substrate is held on the substrate stage during the exposure operation.

11. A maintenance method for a liquid immersion exposure apparatus in which a substrate is exposed through water during an exposure operation, the method comprising:
   cleaning a nozzle member with a cleaning liquid during a cleaning operation;
   after cleaning the nozzle member with the cleaning liquid, supplying water from a supply opening of the nozzle member and collecting the supplied water via a collection opening of the nozzle member; and
   measuring at least either a property or a constituent of the water collected via the collection opening of the nozzle member,
   wherein the nozzle member is cleaned with the cleaning liquid while the nozzle member is detached from the liquid immersion exposure apparatus.

12. The method of claim 11, wherein a result of the cleaning operation is judged based on a result of the measuring.

13. The method of claim 11, wherein the at least either the property or the constituent of the collected water includes total organic carbon.

14. The method of claim 11, wherein the at least either the property or the constituent of the collected water is measured by a measuring instrument which includes a particle counter.

15. A liquid immersion exposure apparatus in which a substrate is exposed through water during an exposure apparatus operation, the apparatus comprising:
   a nozzle member having a supply opening and a collection opening;
   a controller configured to execute the exposure operation, and to execute a cleaning operation such that, during the cleaning operation, (1) a nozzle member is cleaned with a cleaning liquid, (2) water is then supplied from the supply opening of the nozzle member to at least one of an upper surface of a stage and an upper surface of a dummy substrate, and (3) the supplied water is collected from at least one of the upper surface of the stage and the upper surface of the dummy substrate via the collection opening of the nozzle member; and
   a measuring instrument configured to be in fluid communication with the collection opening to measure at least either a property or a constituent of the water collected from at least one of the upper surface of the stage and the upper surface of the dummy substrate via the collection opening of the nozzle member,
   wherein the nozzle member is cleaned with the cleaning liquid while the nozzle member is detached from the liquid immersion exposure apparatus.

16. The apparatus of claim 15, wherein a result of the cleaning operation is judged based on a result of the measuring.

17. The apparatus of claim 15, wherein the at least either the property or the constituent of the collected water includes total organic carbon.

18. The apparatus of claim 15, wherein the at least either the property or the constituent of the collected water is measured by a measuring instrument which includes a particle counter.

19. The apparatus of claim 15, wherein the stage is a substrate stage arranged such that the substrate is held on the substrate stage during the exposure operation.

20. The apparatus of claim 15, wherein the dummy substrate is held on a substrate stage arranged such that the substrate is held on the substrate stage during the exposure operation.

* * * * *